(12) United States Patent
Ebisuno et al.

(10) Patent No.: US 12,261,176 B2
(45) Date of Patent: Mar. 25, 2025

(54) DISPLAY DEVICE HAVING IMPROVED RELIABILITY OF PAD PORTION

(71) Applicant: Samsung Display Co., LTD., Yongin-si (KR)

(72) Inventors: Kohei Ebisuno, Hwaseong-si (KR); Jin-Suk Lee, Gwangmyeong-si (KR); Jong Min Lee, Suwon-si (KR); Jun Young Kim, Suwon-si (KR); Yong Ho Yang, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 175 days.

(21) Appl. No.: 17/541,196

(22) Filed: Dec. 2, 2021

(65) Prior Publication Data
US 2022/0359573 A1 Nov. 10, 2022

(30) Foreign Application Priority Data
May 10, 2021 (KR) ......................... 10-2021-0060109

(51) Int. Cl.
*H01L 27/12* (2006.01)
*G02F 1/1345* (2006.01)
*G02F 1/1362* (2006.01)
*H10K 59/131* (2023.01)

(52) U.S. Cl.
CPC ........ *H01L 27/124* (2013.01); *G02F 1/13458* (2013.01); *G02F 1/136272* (2021.01); *G02F 1/136286* (2013.01); *G02F 1/13629* (2021.01); *H01L 27/1259* (2013.01); *H10K 59/131* (2023.02)

(58) Field of Classification Search
None
See application file for complete search history.

(56) References Cited

U.S. PATENT DOCUMENTS

| 2012/0248450 A1* | 10/2012 | Yaneda | ................... H01L 27/12 257/E21.409 |
|---|---|---|---|
| 2022/0149323 A1 | 5/2022 | Kim et al. | |

FOREIGN PATENT DOCUMENTS

| KR | 10-2016-0075966 | * | 6/2016 | ............ H01L 27/32 |
|---|---|---|---|---|
| KR | 1020160075966 | A | 6/2016 | |
| KR | 1020170081052 | A | 7/2017 | |
| KR | 1020180057805 | A | 5/2018 | |
| KR | 1020210008768 | A | 1/2021 | |
| KR | 1020220065122 | | 5/2022 | |

* cited by examiner

*Primary Examiner* — Lauren Nguyen
(74) *Attorney, Agent, or Firm* — CANTOR COLBURN LLP

(57) ABSTRACT

A display device includes: a substrate including a display area and a non-display area; a transistor and a light emitting element, which are disposed on the display area; a pad portion disposed in the non-display area, where the pad portion includes a first metal pattern; and a printed circuit board or a data driver, which is connected with the pad portion. The transistor includes a semiconductor layer disposed on the substrate and a source electrode or a drain electrode which is electrically connected with the semiconductor layer. The source electrode or the drain electrode includes a first layer including a first metal, a second layer including a second metal, and a third layer including the first metal, where the first metal pattern includes the first metal, and is connected with the printed circuit board or the data driver.

6 Claims, 25 Drawing Sheets

DISPLAY DEVICE HAVING IMPROVED RELIABILITY OF PAD PORTION

This application claims priority to Korean Patent Application No. 10-2021-0060109, filed on May 10, 2021, and all the benefits accruing therefrom under 35 U.S.C. § 119, the content of which in its entirety is herein incorporated by reference.

BACKGROUND

(a) Field

The disclosure relates to a display device.

(b) Description of the Related Art

A display device is a device that visually displays data. The display device typically includes a substrate that is partitioned into a display area and a non-display area. In the display area, a scan line and a data line may be disposed while being insulated from each other, and a plurality of pixels may be included. In such a display device, a transistor and a first electrode electrically connected to the transistor and a second electrode commonly provided to pixels may be provided in the display area corresponding to each pixel. In the non-display area, various signal wires, scan drivers, data drivers, controllers, pads, and the like that transmit electrical signals to the display area may be provided. Such a display device are widely used in various fields. Accordingly, various designs are being tried to improve the quality of display devices.

SUMMARY

Embodiments are for improving reliability of a pad portion of a display device without adding a mask. In such embodiments, wire defects occurring in the pad portion, and pixel defects occurring in the display area may be effectively prevented or substantially minimized.

An embodiment of a display device according to the invention includes: a substrate including a display area and a non-display area; a transistor and a light emitting element, which are disposed on the display area; a pad portion disposed in the non-display area, where the pad portion includes a metal pattern; and a printed circuit board or a data driver, which is connected with the pad portion. In such an embodiment, the transistor includes a semiconductor layer disposed on the substrate and a source electrode or a drain electrode, which is electrically connected with the semiconductor layer, and the source electrode or the drain electrode includes a first layer including a first metal, a second layer including a second metal, and a third layer including the first metal, where the metal pattern includes the first metal, and is connected with the printed circuit board or the data driver.

In an embodiment, the metal may include titanium, and the second metal may include aluminum.

In an embodiment, the metal pattern may include a first sub-metal pattern including the first metal, and a second sub-metal pattern including the second metal.

In an embodiment, the second sub-metal pattern may be connected with the printed circuit board or the data driver.

In an embodiment, a thickness of the second sub-metal pattern may be thinner than a thickness of the second layer.

In an embodiment, a thickness of the second layer may be in a range from about 5000 angstroms to about 8000 angstroms, and a thickness of the second sub-metal pattern may be about 1000 angstroms or less.

In an embodiment, the display device may further include a connection electrode which electrically connects the drain electrode and the light emitting element to each other.

In an embodiment, the connection electrode may include: a fourth layer including the first metal; a fifth layer including the second metal; and a sixth layer including the first metal.

An embodiment of a display device according to the invention includes: a substrate including a display area and a non-display area; a semiconductor layer disposed on the substrate; a gate electrode disposed on the semiconductor layer; a source electrode or a drain electrode, which is disposed on the gate electrode; a connection electrode disposed on the source electrode or the drain electrode; a light emitting element disposed on the connection electrode; a pad portion disposed in the non-display area; and a printed circuit board or a data driver, which is connected with the pad portion. In such an embodiment, the connection electrode includes: a fourth layer including a first metal; a fifth layer including a second metal; and a sixth layer including the first metal, the pad portion include: a signal wire including a same material as the gate electrode; a first metal pattern disposed on the signal wire, where the first metal pattern includes a same material as the source electrode or the drain electrode; and a second metal pattern disposed on the first metal pattern, and the second metal pattern includes a first second sub-metal pattern including the first metal.

In an embodiment, the second metal pattern may further include a second second sub-metal pattern including the second metal.

In an embodiment, a thickness of the second second sub-metal pattern may be thinner than a thickness of the fifth layer.

In an embodiment, a thickness of the fifth layer may be in a range from about 5000 angstroms to about 8000 angstroms, and a thickness of the second second sub-metal pattern may be about 1000 angstroms or less.

An embodiment of a manufacturing method of a display device according to the invention includes: providing a gate electrode and a signal wire on a substrate; providing an insulation layer on the signal wire; providing a source electrode, a drain electrode, and a first metal layer on the insulation layer; providing a second metal layer on the first metal layer; forming a connection electrode by etching the second metal layer; and removing the second metal layer that overlaps a non-display area.

In an embodiment, the first metal layer may include a first first layer, a second first layer, and a third first layer, and the manufacturing method may further include removing the third first layer.

In an embodiment, the manufacturing method of the display device may further include forming a first metal pattern by partially removing a portion of the second first layer overlapping the non-display area.

In an embodiment, the first metal pattern may include: a first first sub-metal pattern including the first metal, and a second first sub-metal pattern including the second metal. In such an embodiment each of the source electrode and the drain electrode may include a first layer including the first metal, a second layer including the second metal, and a third layer including the first metal, where a thickness of the second first sub-metal pattern is less than a thickness of the second layer.

In an embodiment, the thickness of the second first sub-metal pattern may be less than about 1000 angstroms In an embodiment, the manufacturing method of the display device may further include removing a portion of the second first layer overlapping the non-display area.

In an embodiment, the manufacturing method of the display device may further include forming a first electrode which is electrically connected with the connection electrode.

In an embodiment, an etching solution used to remove the second first layer and an etching solution used to form the first electrode may be different from each other.

According to embodiments, reliability of the display device may be improved by controlling a wire defect occurring in the non-display area or a pixel defect occurring in the display area

DETAILED DESCRIPTION OF THE EMBODIMENTS

Figure 1A:
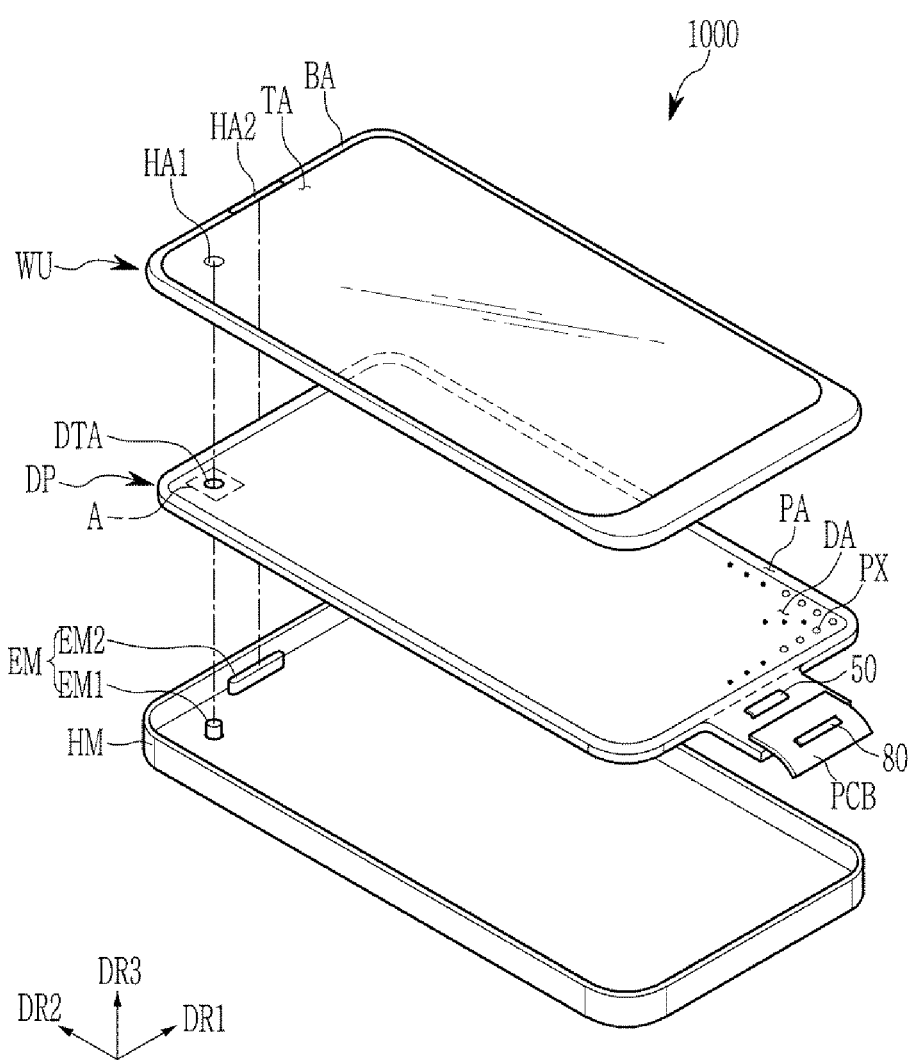
FIG. 1A is an exploded perspective view of a display device according to an embodiment.

The invention will be described more fully hereinafter with reference to the accompanying drawings, in which various embodiments of the invention are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

The drawings and description are to be regarded as illustrative in nature and not restrictive. Like reference numerals designate like elements throughout the specification.

In addition, since the size and thickness of each configuration shown in the drawings are arbitrarily indicated for better understanding and ease of description, the invention is not necessarily limited to the drawings. In the drawings, the thickness of layers, films, panels, regions, etc., are exaggerated for clarity. In addition, in the drawings, the thickness of some layers and regions is exaggerated for better understanding and ease of description.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, throughout the specification, the word "on" a target element will be understood to mean positioned above or below the target element, and will not necessarily be understood to mean positioned "at an upper side" based on an opposite to gravity direction.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Further, throughout the specification, the phrase "on a plane" means when viewing a target portion from the top, and the phrase "on a cross-section" means when viewing a cross-section formed by vertically cutting a target portion from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, referring to FIG. 1A and FIG. 1B, a display device according to an embodiment will be described in detail. FIG. 1A is an exploded perspective view of a display device according to an embodiment, and FIG. 1B is a schematic cross-sectional view of the display device according to an embodiment.

Figure 1B:
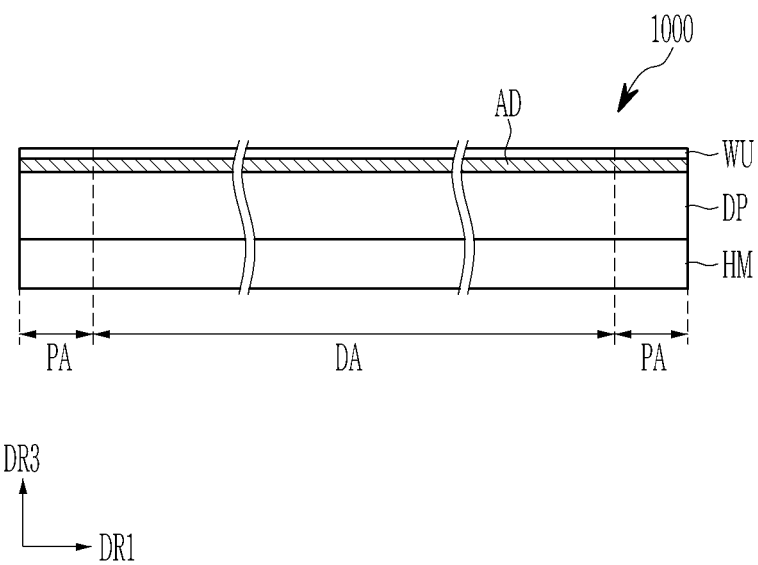
FIG. 1B is a schematic cross-sectional view of the display device according to an embodiment.

First, referring to FIG. 1A and FIG. 1B, an embodiment of a display device 1000 displays an image toward a third direction DR3 on a plane defined by a first direction DR1 and a second direction DR2. A front (or top) and a back (or bottom) sides of each member are separated in the third direction DR3. Directions indicated by the first to third directions DR1, DR2, and DR3 are relative concepts and may be converted into other directions.

As shown in FIG. 1A, an embodiment of the display device 1000 may display a motion picture or a still image. In one embodiment, for example, the display device 1000 may be a portable electronic device including a display screen such as a mobile phone, a smart phone, a tablet personal computer ("PC"), a mobile communication terminal, an electronic notebook, an electronic book, a portable multimedia player ("PMP"), a navigation system, an ultra-mobile PC ("UMPC"), and the like, but also be other various products such as a television, a laptop, a monitor, an advertisement board, an Internet of things ("IoT"), and the like. In an embodiment, the display device 1000 may be used or included in a wearable device such as a smart watch, a watch phone, a spectacles type of display, and a head mounted display ("HMD"). In an embodiment, the display device 1000 may be used in instrument panel of a vehicle, a center fascia of the vehicle, or a center information display ("CID") disposed on a dashboard, and a room mirror display that replaces a side mirror of the vehicle, or a display disposed on the back of the front seat for entertainment. For ease of illustration and description, FIG. 1A shows an embodiment where the display device 1000 is used as a smart phone.

In an embodiment, the display device 1000 includes a cover window WU, a display panel DP, and a housing member HM. In such an embodiment, the cover window WU, the display panel DP, and the housing member HM are coupled to each other in a way such that the display device 1000 may be formed.

The cover window WU is disposed on the display panel DP to protect the display panel DP. The cover window WU may include a polyimide window or an ultra-thin glass window.

The cover window WU may include a transmission area TA and a blocking area BA. The transmission area TA is an optically transparent region, and may be a region that transmits incident light. The blocking area BA may be a region having relatively low light transmittance compared to the transmission area TA. The blocking area BA defines the shape of the transmission area TA. The blocking area BA may surround the transmission area TA. The blocking area BA may represent a predetermined color. The blocking area BA may overlap a peripheral area PA of the display panel DP to block the peripheral area PA from being viewed from the outside.

The cover window WU may include a first hole area HA1 and a second hole area HA2. Herein, when an element is described as including a hole or opening, it means such a hole or opening is defined in or through the element. Each of the first hole area HA1 and the second hole area HA2 may overlap an electronic module EM to be described later. The electronic module EM may operate by receiving external signals provided through the first hole area HA1 and the second hole area HA2.

According to one embodiment, for example, the first hole area HA1 may be disposed in the transmission area TA, and the second hole area HA2 may be disposed in the blocking area BA, as shown in FIG. 1B, but is not particularly limited thereto. In an alternative embodiment, the first hole area HA1 and the second hole area HA2 may be disposed in regions opposite to each other, both may be disposed in the transmission area TA, or both may be disposed in the blocking area BA.

The first hole area HA1 and the second hole area HA2 may have different shapes from each other. The first hole area HA1 may have a circular shape on a plane, and the second hole area HA2 may have an elliptical shape having a long axis extending along the first direction DR1 on a plane. However, the shapes of the first hole area HA1 and the second hole area HA2 are not limited thereto, and the size or shape may be variously modified.

In an embodiment, the display panel DP may be a flat rigid display panel, but is not particularly limited thereto. Alternatively, the display panel DP may be a flexible display panel. In an embodiment, the display panel may be a light emitting display panel, but is not particularly limited thereto. In one embodiment, for example, the display panel may be an organic light emitting display panel or a quantum dot light emitting display panel. An emission layer of the organic light emitting panel may include an organic light emitting material. The emission layer of the quantum dot light emitting display panel may include quantum dots and quantum rods. Hereinafter, for ease of description, embodiments where the display panel is an organic light emitting panel will be described in detail.

In an embodiment, the display panel DP displays an image on the front. The front of the display panel DP includes a display area DA and a peripheral area PA. The image is displayed in the display area DA. The peripheral area PA may surround the display area DA.

The display panel DP may include a plurality of pixels PXs disposed in the display area DA. The pixel PX may display light in response to an electrical signal. The light displayed by the pixels PX may implement an image. The number of transistors, the number of capacitors, and the connection relationship included in one pixel PX may be variously modified.

In an embodiment, the display panel DP may include an opening DTA defined or passing therethrough. The opening DTA may be disposed in the display area DA. The opening DTA may overlap the first hole area HA1 of the cover window WU. Some of the plurality of pixel PXs may be disposed to surround the opening DTA. Therefore, the image may also be displayed in the region adjacent to the opening DTA.

The display panel DP includes the peripheral area PA extending from the display area DA, and a plurality of signal lines and a pad portion are positioned in the peripheral area OA. A data driver 50 may be disposed in the peripheral area PA. According to an embodiment, the pad portion of the peripheral area PA may be electrically connected to a printed circuit board PCB including a driving chip (or an integrated circuit driving chip) 80, and hereinafter, this will be described in greater detail with reference to FIG. 2.

In an embodiment, as shown in FIG. 1B, an adhesive layer AD that combines the display panel DP and the cover window WU may be disposed between the display panel DP and the cover window WU. In such an embodiment, although not shown, a touch unit disposed between the display panel DP and the cover window WU may be further included. The touch unit may be disposed on the display panel DP for the touchscreen function of the display device 1000. The touch unit may include touch electrodes of various patterns, and may be a resistive film type or a capacitive type.

An electronic module EM includes various functional modules to operate the display device 1000. The electronic module EM may be electrically connected to the display panel DP through a connector (not shown) and the like. In one embodiment, for example, the electronic module EM may be a camera, a speaker, or a sensing sensor such as for sensing light or heat.

The electronic module EM may include a first electronic module EM1 and a second electronic module EM2. The first electronic module EM1 may detect an external object received through the opening DTA and the first hole area HA1. The first electronic module EM1 may receive an external input transmitted through the opening DTA and the first hole area HA1, or may provide an output through the opening DTA and the first hole area HA1.

In one embodiment, for example, the first electronic module EM1 may be at least one selected from a light emitting module, a light sensing module, and an imaging module. In one embodiment, for example, the first electronic module EM1 may include at least one selected from a light emitting module for outputting infrared rays, a complementary metal-oxide-semiconductor ("CMOS") sensor for detecting infrared rays, and a camera module for photographing an external subject.

The second electronic module EM2 may collect an acoustic signal such as a voice through the second hole area HA2 or provide an acoustic signal such as a processed voice to the outside. In one embodiment, for example, the second electronic module EM2 may include at least one selected from an acoustic input module and an acoustic output module, or may include a sensor. The acoustic input module may include a microphone capable of receiving a sound signal as an input. The acoustic output module may include a speaker that outputs acoustic data as a sound signal.

Alternatively, the electronic module EM may be formed of a single module, may further include a larger number of electronic modules, or may be arranged in various positions in the display device 1000, and is not limited to any one embodiment.

The housing member HM is disposed on the lower side of the display panel DP. The housing member HM is combined with the cover window WU to constitute the exterior of the display device 1000. The housing member HM may include a material with relatively high stiffness. In one embodiment, for example, the housing member HM may include a plurality of frames and/or plates including or made of glass, plastic, and/or metal.

The housing member HM provides a predetermined accommodation space. The display panel DP may be accommodated in the accommodation space and protected from external impact.

Figure 2:
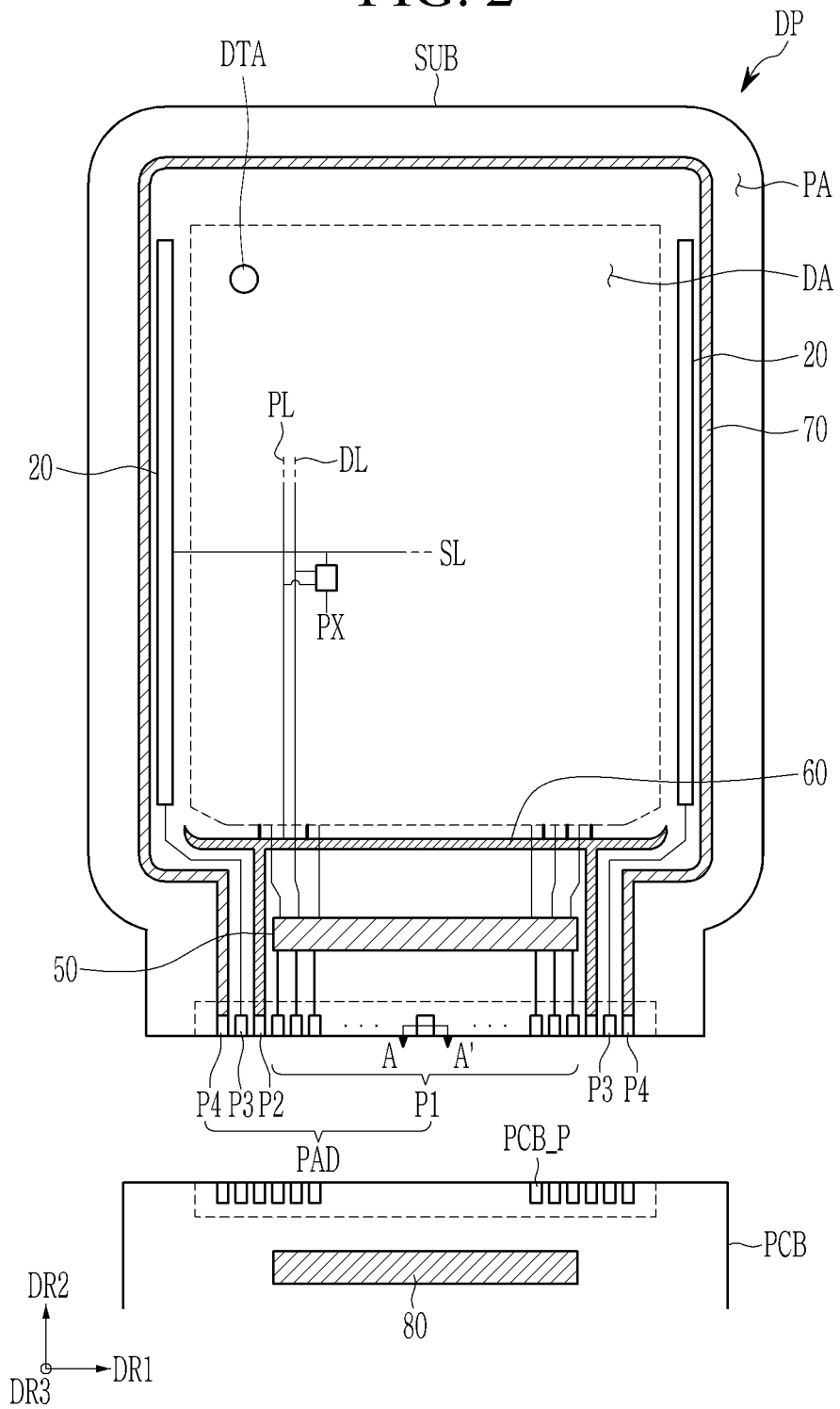
FIG. 2 is a top plan view of some constituent elements of the display panel according to an embodiment.

Hereinafter, referring to FIG. 2, the display panel according to an embodiment will be described. FIG. 2 is a top plan view of some constituent elements of the display panel according to an embodiment. An repetitive detailed description of the same or like constituent elements as those described above may be omitted.

In an embodiment, as described above, the display panel DP includes a substrate SUB including the display area DA, and the peripheral area PA. The peripheral area PA may be defined along the edge of the display area DA.

The display panel DP includes a plurality of pixels PX. The plurality of pixels PX may be disposed in the display area DA on the substrate SUB. Each pixel PX includes a light emitting element and a driving circuit connected to the light emitting element. Each pixel PX emits light of, for example, red, green, and blue, or white, and may include, for example, an organic light emitting diode.

The display panel DP may include a plurality of signal lines and a pad portion. The plurality of signal lines may include a scan line SL extending in a first direction DR1, a data line DL and a driving voltage line PL extending in a second direction DR2, and the like.

The scan driver 20 generates and transmits a scan signal to each pixel PX through the scan line SL. In an embodiment, the scan driver 20 may be disposed to the left and right sides of the display area DA. In such an embodiment, scan drivers 20 are disposed at opposite sides of the substrate SUB, as shown in FIG. 2. Alternatively, the scan driver may be disposed only at one side of the substrate SUB.

The pad portion PAD is disposed at one end of the display panel DP, and includes a plurality of terminals P1, P2, P3, and P4. Embodiments of the pad portion PAD will be described later in detail with reference to FIG. 4A, FIG. 5A, FIG. 6A, and FIG. 6B showing cross-sectional views taken along line A-A'. The pad portion PAD is exposed rather than being covered by the insulation layer and thus may be electrically connected with the printed circuit board PCB. The pad portion PAD may be electrically connected with a pad portion PCB_P of the printed circuit board PCB. The printed circuit board PCB may transmit a signal of the driving chip 80 or power to the pad portion PAD.

A plurality of video signals transmitted from the outside are converted to a plurality of image data signals, and the converted signals are transmitted to the data driver 50 through the terminal P1. In addition, a control signal for controlling the operation of the scan driver 20 and the data driver 50 may be generated and transmitted to each through terminals P3 and P1. In addition, a driving voltage ELVDD is transmitted to the driving voltage supply wire 60 through the terminal P2. In addition, a transfer common voltage ELVSS is transmitted to each common voltage supply wire 70 through the terminal P4.

The data driver 50 is disposed on the peripheral area PA, and generates and transmits a data signal to each pixel PX. The data driver 50 may be disposed on one side of the display panel DP, for example, may be disposed between the pad portion PAD and the display area DA.

The driving voltage supply wire 60 is disposed on the peripheral area PA. In one embodiment, for example, a driving voltage supply wire 60 may be disposed between the data driver 50 and the display area DA. The driving voltage supply wire 60 provides the driving voltage ELVDD to the pixel PXs. The driving voltage supply wire 60 may be disposed in a first direction DR1 and may be connected to a plurality of driving voltage lines PL disposed in a second direction DR2.

A common voltage supply wire 70 is disposed on the peripheral area PA. The common voltage supply wire 70 may have a shape surrounding the substrate SUB. The common voltage supply wire 70 transmits a common voltage ELVSS to one electrode (e.g., a second electrode) of the light emitting element included in the pixel PX.

Figure 3A:
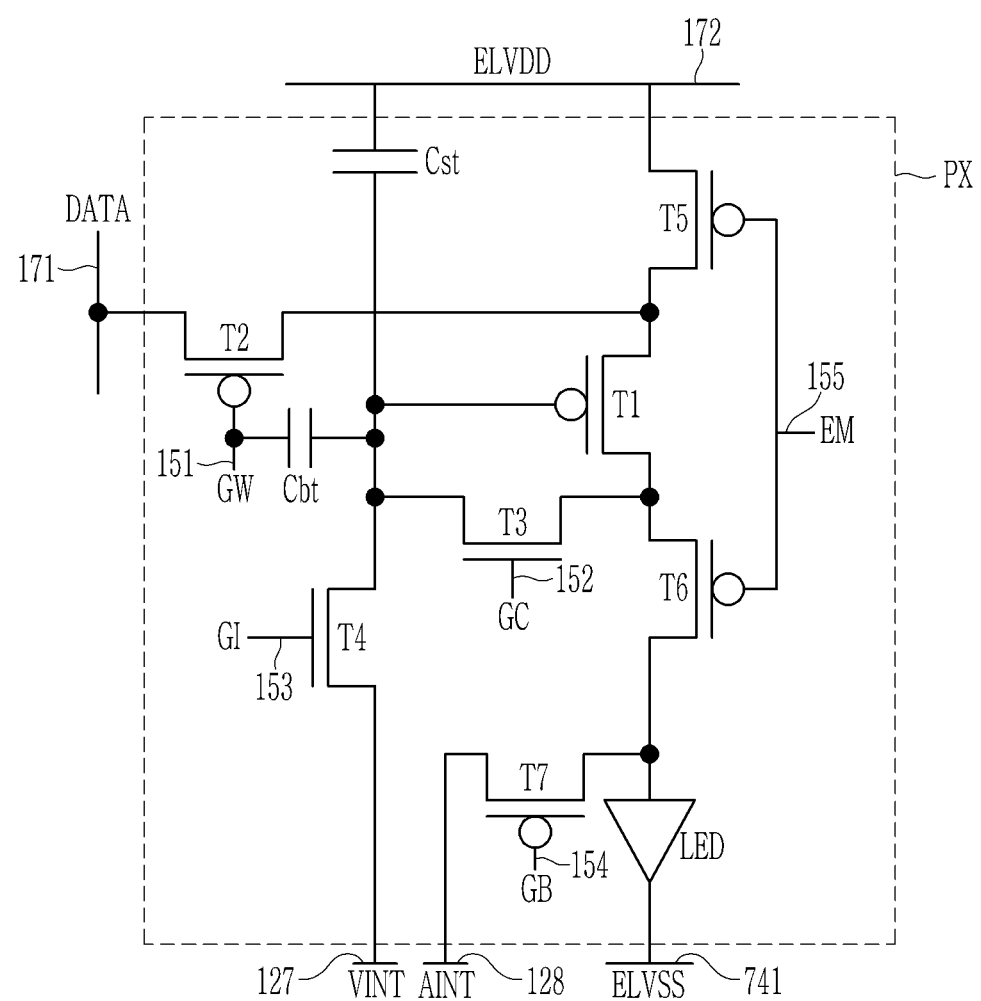
FIG. 3A is a circuit diagram of a pixel of the display device according to an embodiment.
Figure 3B:
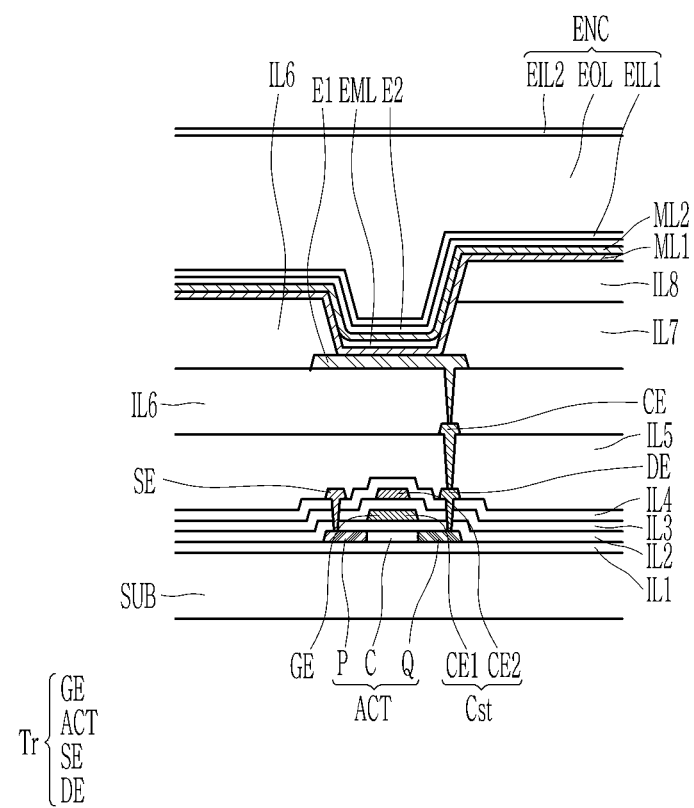
FIG. 3B is a cross-sectional view of the display area according to an embodiment.
Figure 3C:
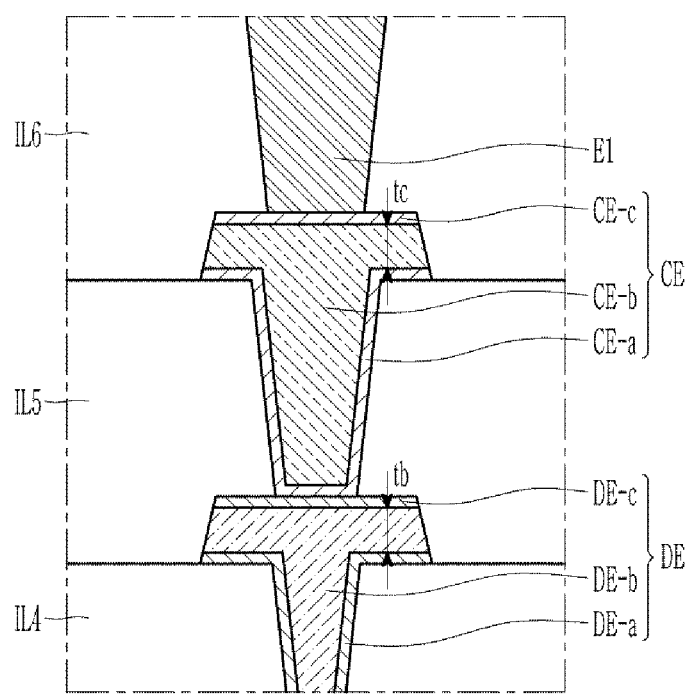
FIG. 3C is an enlarged view of some area.
Figure 3D:
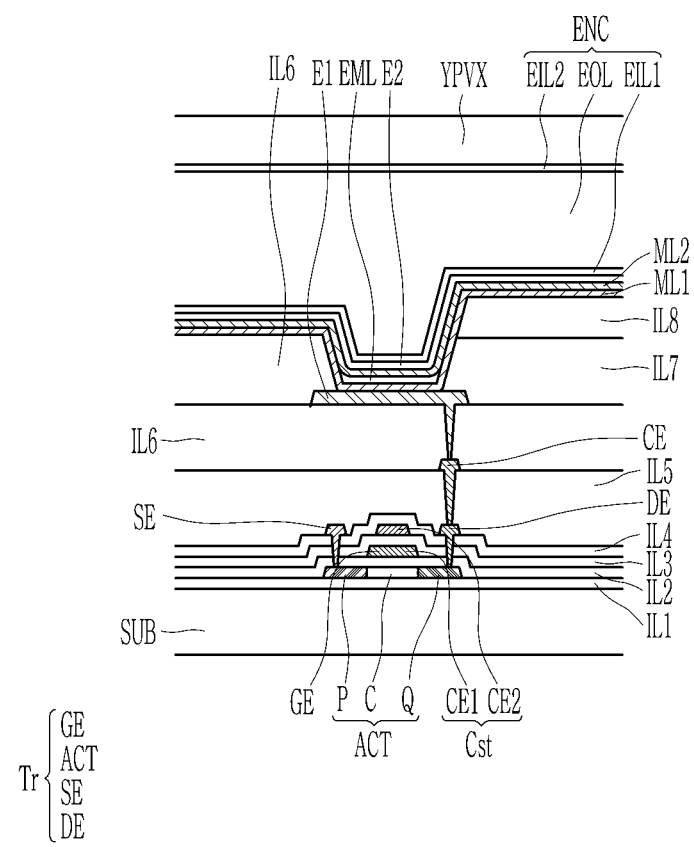
FIG. 3D is a cross-sectional view of the display panel of the display area according to an embodiment.

Hereinafter, one pixel will be described with reference to FIG. 3A to FIG. 3D. FIG. 3A is a circuit diagram of a pixel of the display device according to an embodiment, FIG. 3B is a cross-sectional view of the display area according to an embodiment, FIG. 3C is an enlarged view of some area, and FIG. 3D is a cross-sectional view of the display panel of the display area according to an embodiment.

First, referring to FIG. 3A, an embodiment of one pixel PX of the display device includes a plurality of transistors T1, T2, T3, T4, T5, T6, and T7 connected to a plurality of wires 127, 128, 151, 152, 153, 154, 155, 171, 172, and 741, a storage capacitor Cst, a boost capacitor Cbt, and a light emitting diode LED.

Each pixel PX is connected with the plurality of wires 127, 128, 151, 152, 153, 154, 155, 171, 172, and 741. The plurality of wires include a first initialization voltage line 127, a second initialization voltage line 128, a first scan signal line 151, a second scan signal line 152, an initialization control line 153, a bypass control line 154, a light emission control line 155, a data line 171, a driving voltage line 172, and a common voltage line 741.

The first scan signal line 151 is connected to a gate driver (not shown) and transmits a first scan signal GW to the second transistor T2. The second scan signal line 152 may be applied with a voltage of opposite polarity to a voltage applied to the first scan signal line 151 at the same timing as the signal of the first scan signal line 151. In one embodiment, for example, when a negative voltage is applied to the first scan signal line 151, a positive voltage may be applied to the second scan signal line 152. The second scan signal line 152 transmits the second scan signal GC to the third transistor T3.

The initialization control line 153 transmits an initialization control signal GI to the fourth transistor T4. The bypass control line 154 transmits a bypass signal GB to the seventh transistor T7. The bypass control line 154 may be formed as or defined by the first scan signal line 151 of the previous stage. The light emission control line 155 transmits a light emission control signal EM to the fifth transistor T5 and the sixth transistor T6.

The data line 171 is a wire that transmits a data voltage DATA generated by a data driver (not shown), and luminance of the light emitting diode LED is changed according to the data voltage DATA applied to the pixel PX.

The driving voltage line 172 applies a driving voltage ELVDD. The first initialization voltage line 127 transmits a first initialization voltage VINT, and the second initialization voltage line 128 transmits a second initialization voltage AINT. The common voltage line 741 applies a common voltage ELVSS to a cathode of the light emitting diode LED. In an embodiment, voltages applied to the driving voltage line 172, the first and second initialization voltage lines 127 and 128, and the common voltage line 741 may be constant voltages, respectively.

The plurality of transistors may include a driving transistor T1, a second transistor T2, a third transistor T3, a fourth transistor T4, a fifth transistor T5, a sixth transistor T6, and a seventh transistor T7. The plurality of transistors may include an oxide transistor including an oxide semiconductor and a silicon transistor including a polysilicon semiconductor. In one embodiment, for example, the third transistor T3 and the fourth transistor T4 may be an oxide transistor, and the driving transistor T1, the second transistor T2, the fifth transistor T5, the sixth transistor T6, and the seventh transistor T7 may each be a silicon transistor. Alternatively, the third transistor T3, the fourth transistor T4, and the seventh transistor T7 may be an oxide transistor, and the driving transistor T1, the second transistor T2, the fifth transistor T5, and the sixth transistor T6 may be a silicon transistor. However, the invention is not limited thereto, and the plurality of transistors may all be silicon transistors.

Although FIG. 3A shows one embodiment of one pixel PX including seven transistors T1 to T7, a single sustain capacitor Cst, and a single boost capacitor Cbt, the invention is not limited thereto, and the number of transistors and capacitors and the connection relationship may be variously changed or modified.

Next, referring to FIG. 3B, a stacked structure of the transistors and the light emitting element disposed in the display area DA will be described. FIG. 3B shows the stacked structure of the simplified display area DA, and may be applicable to any stacked structure for implementing the circuit of FIG. 3A.

Referring to FIG. 3B, the substrate SUB may have various degrees of flexibility. The substrate SUB may be a rigid substrate or a flexible substrate capable of bending, folding, rolling, and the like.

The substrate SUB may include a glass material or a polymer resin. In one embodiment, for example, the polymer resin may include at least one selected from polyethersulfone, polyacrylate, polyether imide, polyethylene naphthalate, polyethylene terephthalate, polyphenylene sulfide, polyarylate, polyimide, polycarbonate, cellulose acetate propionate, and the like.

The substrate SUB may have a multi-layer structure including a layer including the above-described polymer resin, and an inorganic layer (not shown).

A buffer layer IL1 may be disposed on the substrate SUB. The buffer layer IL1 blocks an impurity from the substrate SUB from being transmitted to an upper layer of the buffer layer IL1, particularly, a semiconductor layer ACT, thereby preventing characteristic degradation of the semiconductor layer ACT and reducing stress. The buffer layer IL1 may be single layered or multi-layered including at least one selected from a silicon oxide (SiOx), a silicon nitride (SiNx), and a silicon oxide (SiOxNy). Herein, the term "single layered" may mean having a single layer structure, and the term "multi-layered" may means having a multilayer structure. Alternatively, some or all of the buffer layer IL1 may be omitted.

The semiconductor layer ACT is disposed on the buffer layer IL1. The semiconductor layer ACT may include at least one selected from polysilicon and oxide semiconductor. The semiconductor layer ACT includes a channel region C, a first region P, and a second region Q. The first region P and the second region Q are disposed on respective sides of the channel region C. The channel region C may include a semiconductor doped with a small amount of impurity or undoped with an impurity, and the first region P and the second region Q may include a semiconductor doped with a large amount of impurity compared to the channel region C. In an embodiment, where the semiconductor layer ACT may include or be formed of an oxide semiconductor, a separate protective layer (not shown) may be added to protect the oxide semiconductor material, which is vulnerable to external environments such as high temperature.

The first insulation layer IL2 is disposed on the semiconductor layer ACT. The first insulation layer IL2 may be single layered or multi-layered including at least one selected from inorganic insulators such as a silicon oxide, a silicon nitride, a silicon oxynitride, an aluminum oxide, a titanium oxide, a tantalum oxide, and a hafnium oxide.

A gate electrode GE and a lower electrode CE1 are disposed on the first insulation layer IL2. The lower electrode CE1 may be a part of the gate electrode GE.

The gate electrode GE may be single layered or multi-layered in which a metal film including at least one selected from copper (Cu), a copper alloy, aluminum (Al), an aluminum alloy, molybdenum (Mo), a molybdenum alloy, titanium (Ti), and a titanium alloy is laminated. The gate electrode GE may overlap the channel region C of the semiconductor layer ACT.

The second insulation layer IL3 is disposed on the gate electrode GE and the first insulation layer IL2. A second insulation layer IL3 may be single layered or multi-layered including at least one selected from inorganic insulators such as a silicon oxide, a silicon nitride, a silicon oxynitride, an aluminum oxide, a titanium oxide, a tantalum oxide, and a hafnium oxide.

The upper electrode CE2 of the storage capacitor Cst is disposed on the second insulation layer IL3.

The storage capacitor Cst may include a lower electrode CE1 and an upper electrode CE2 that overlap each other with the second insulation layer IL3 disposed therebetween. According to an embodiment, the gate electrode GE is the lower electrode CE1 of the storage capacitor Cst as shown in FIG. 3B, but is not limited thereto, and the lower electrode CE1 may be formed as or defined by a separate electrode.

A third insulation layer IL4 is disposed on the upper electrode CE2. The third insulation layer IL4 may be single layered or multi-layered including at least one selected from inorganic insulators such as a silicon oxide, a silicon nitride, a silicon oxynitride, an aluminum oxide, a titanium oxide, a tantalum oxide, and a hafnium oxide.

A source electrode SE and a drain electrode DE are disposed on the third insulation layer IL4. The source electrode SE and the drain electrode DE are respectively connected to the first region P and the second region Q of the semiconductor layer ACT through contact holes defined or formed in the first insulation layer IL2, the second insulation layer IL3, and the third insulation layer IL4.

The source electrode SE and drain electrode DE may include a conductive material including molybdenum (Mo), aluminum (Al), copper (Cu), titanium (Ti), and the like, and may have a multi-layer structure or a single layer structure, each layer including at least one selected from the above materials.

According to an embodiment, the source electrode SE and the drain electrode DE may be formed as a triple layer or have a triple layer structure. As shown in FIG. 3C, the source electrode SE and the drain electrode DE may include a first layer DE-a including a first metal, a second layer DE-b including a second metal, and a third layer DE-c including the first metal. The first layer DE-a and the third layer DE-c may include a same metal as each other. In one embodiment, for example, the first layer DE-a and the third layer DE-c may include titanium, and the second layer DE-b may include aluminum. The source electrode SE and drain electrode DE may be formed of or have a multi-layer structure of a titanium layer, an aluminum layer, and a titanium layer (Ti/Al/Ti).

The thickness of the first layer DE-a and the third layer DE-c may be smaller than a thickness of the second layer DE-b. In one embodiment, for example, the first layer DE-a and the third layer DE-c may have a thickness in a range from about 100 angstroms to about 500 angstroms, and the second layer DE-b may have a thickness in a range from about 5000 angstroms to about 8000 angstroms. The first layer DE-a and the third layer DE-c may have aa same thickness s or different thicknesses from each other. In one embodiment, for example, the thickness of the third layer DE-c may be smaller than the thickness of the first layer DE-a.

The fourth insulation layer IL5 is disposed on the third insulation layer IL4, the source electrode SE, and the drain electrode DE. The fourth insulation layer IL5 may include a general-purpose polymer such as polymethylmethacrylate ("PMMA") or polystyrene ("PS"), a polymer derivative with a phenolic group, an acryl-based polymer, an imide-based polymer, an arylether-based polymer, an amide-based polymer, a fluorine-based polymer, p-xylene-based polymers, vinyl alcohol-based polymers, and blends thereof.

A connection electrode CE is disposed on the fourth insulation layer IL5. The connection electrode CE may be connected to the drain electrode DE through a contact hole defined or formed in the fourth insulation layer IL5.

The connection electrode CE may include a conductive material including molybdenum (Mo), aluminum (Al), copper (Cu), titanium (Ti), and the like, and may have a multi-layer structure or a single layer structure, each layer including at least one selected from the above materials.

According to the embodiment, the connection electrode CE may be formed as a triple layer. As shown in FIG. 3C, the connection electrode CE may include a fourth layer CE-a including the first metal, a fifth layer CE-b including the second metal, and a sixth layer CE-c including the first metal. The fourth layer CE-a and the sixth layer CE-c may include a same metal as each other. In one embodiment, for example, the fourth layer CE-a and the sixth layer CE-c may include titanium, and the fifth layer CE-b may include aluminum. The connection electrode CE may have a multi-layer structure of a titanium layer, an aluminum layer, and a titanium layer (Ti/Al/Ti).

The thickness of the fourth layer CE-a and the sixth layer CE-c may be smaller than a thickness of the fifth layer CE-b.

In one embodiment, for example, the fourth layer CE-a and the sixth layer CE-c may have a thickness in a range from about 100 angstroms to about 500 angstroms, and the fifth layer CE-b may have a thickness in a range from about 5000 angstroms to about 8000 angstroms. The fourth layer CE-a and the sixth layer CE-c may have a same thickness as or different thicknesses from each other. In one embodiment, for example, a thickness of the sixth layer CE-c may be smaller than a thickness of the fourth layer CE-a.

A fifth insulation layer IL6 is disposed on the connection electrode CE. The fifth insulation layer IL6 may include a general-purpose polymer such as PMMA or PS, a polymer derivative with a phenolic group, an acryl-based polymer, an imide-based polymer, an arylether-based polymer, an amide-based polymer, a fluorine-based polymer, p-xylene-based polymers, vinyl alcohol-based polymers, and blends thereof.

The first electrode E1 may be disposed on the fifth insulation layer IL6. The first electrode E1 may be connected to the connection electrode CE through a contact hole of the fifth insulation layer IL6, and is electrically connected to the drain electrode DE.

The first electrode E1 may include a metal such as silver (Ag), lithium (Li), calcium (Ca), aluminum (Al), magnesium (Mg), gold (Au), and the like, or may include a transparent conductive oxide ("TCO") such as indium tin oxide ("ITO") and indium zinc oxide ("IZO"). The first electrode E1 may be formed of or defined by a single layer including a metallic material or a transparent conductive oxide, or a multi-layer including these.

A transistor Tr formed of (or collectively defined by) the gate electrode GE, the semiconductor layer ACT, the source electrode SE, and the drain electrode DE is electrically connected to the first electrode E1 and thus supplies a current to the light emitting diode.

A pixel defining layer IL7 is disposed on the first electrode E1. The pixel defining layer IL7 overlaps at least a part of the first electrode E1. In an embodiment, the pixel defining layer IL7 overlaps the edge of the first electrode E1.

The pixel defining layer IL7 includes an opening that defines a light emitting region. In one embodiment, for example, a width of the opening exposing the upper surface of the first electrode E1 may correspond to a width of the light emitting region from which light is emitted, or a width of the pixel. The opening may have an octagonal shape of a rhombus or similar to a rhombus on a plane, but is not limited thereto, and may have any shape such as a quadrangle, a polygon, a circle, or an oval.

A spacer IL8 may be disposed on the pixel defining layer IL7. In an embodiment, the pixel defining layer IL7 and the spacer IL8 may include organic insulating materials such as a general-purpose polymer such as PMMA or PS, a polymer derivative with a phenolic group, an acryl-based polymer, an imide-based polymer, a polyimide, an acryl-based polymer, or a siloxane-based polymer. Alternatively, the pixel defining layer IL7 may include an inorganic insulating material such as a silicon nitride, a silicon oxynitride, or a silicon oxide. Alternatively, the pixel defining layer IL7 may include an organic insulator and an inorganic insulator. In an embodiment, the pixel defining layer IL7 includes a light blocking material and may be provided in black. The light blocking material may include carbon black, carbon nanotubes, a resin or paste containing a black dye, metal particles, for example, nickel, aluminum, molybdenum, and its alloy, metal oxide particles (e.g., chromium oxide) or metal nitride particles (e.g., chromium nitride) and the like. In an embodiment where the pixel defining layer IL7 includes a light blocking material, reflection of external light may be reduced by metal structures disposed under the pixel defining layer IL7.

An emission layer EML is disposed on the first electrode E1. The emission layer EML may contain organic and/or inorganic materials. The emission layer EML may generate light of a predetermined color. The emission layer EML may be disposed only within the opening of the pixel defining layer IL7 using a mask.

Functional layers ML1 and ML2 may be disposed above and below the emission layer EML. The first functional layer ML1 may include at least one of a hole injection layer ("HIL") and a hole transport layer ("HTL"), and the second functional layer ML2 may be a multilayer including at least one of an electron transport layer ("ETL") and an electron injection layer ("EIL").

The functional layers ML1 and ML2 may overlap the entire surface of the display area DA of the substrate SUB. In the display area DA, emission layers EML of colors corresponding to the color of the corresponding pixel may be disposed to be spaced apart from each other, while the functional layers ML1 and ML2 may be formed to cover the display area DA as a whole. Each of the functional layers ML1 and ML2 may be shared by a plurality of pixels disposed in the display area DA. Each of the functional layers ML1 and ML2 may cover a plurality of first electrodes E1.

The second electrode E2 is disposed on the second functional layer ML2. The second electrode E2 may include a reflective metal including calcium (Ca), barium (Ba), magnesium (Mg), aluminum (Al), silver (Ag), gold (Au), nickel (Ni), chromium (Cr), lithium (Li), calcium (Ca), and the like, or a TCO such as ITO or IZO.

The first electrode E1, the emission layer EML and the second electrode E2 may constitute a light emitting element. Here, the first electrode E1 may be an anode that is a hole injection electrode, and the second electrode E2 may be a cathode that is an electron injection electrode. However, the embodiment is not limited thereto, and depending on the driving method of a light emitting display device, the first electrode E1 may become a cathode and the second electrode E2 may become an anode.

Holes and electrons are respectively injected into the emission layer EML from the first electrode E1 and the second electrode E2, and light emission occurs when the excitons combined with the injected holes and electrons fall from the exited state to the ground state.

An encapsulation layer ENC is disposed on the second electrode E2. The encapsulation layer ENC may cover and seal not only the top surface of the light emitting diode, but also the side surfaces. Since the light emitting element is very vulnerable to moisture and oxygen, the encapsulation layer ENC seals the light emitting element to block the inflow of external moisture and oxygen.

The encapsulation layer ENC may include a plurality of layers, among which the encapsulation layer ENC may be formed as a composite film including both an inorganic layer and an organic layer, and for example, the first encapsulation inorganic layer EIL1, an encapsulation organic layer EOL, and a second encapsulation inorganic layer EIL2 may be sequentially formed as a triple layer.

The first encapsulation inorganic layer EIL1 may cover the second electrode E2. The first encapsulation inorganic layer EIL1 may prevent external moisture or oxygen from penetrating into the light emitting element. In one embodiment, for example, the first encapsulation inorganic layer EIL1 may be single layered or multi-layered containing at least one inorganic material selected from an aluminum oxide, a titanium oxide, a tantalum oxide, a hafnium oxide, a zinc oxide, a silicon oxide, a silicon nitride, and a silicon oxynitride. The first encapsulation inorganic layer EIL1 may be formed through a deposition process.

The encapsulation organic layer EOL may be disposed on the first encapsulation inorganic layer EIL1 and contact the first encapsulation inorganic layer EIL1. Curves formed on an upper surface of the first encapsulation inorganic layer EIL1 or particles existing on the first encapsulation inorganic layer EIL1 are covered by the encapsulation organic layer EOL, and thus a surface state of the upper surface of the first encapsulation inorganic layer EIL1 may block the influence on components formed on the encapsulation organic layer EOL. In addition, the encapsulation organic layer EOL can relieve the stress between the contacting layers. The encapsulation organic layer EOL may include organic materials and may be formed through a solution process such as a spin coating, a slit coating, and an inkjet process.

The second encapsulation inorganic layer EIL2 is disposed on the encapsulation organic layer EOL to cover the encapsulation organic layer EOL. The second encapsulation inorganic layer EIL2 may be stably formed on a relatively flatter surface than that of the first encapsulation inorganic layer EIL1. The second encapsulation inorganic layer EIL2 prevents outflow to the outside by encapsulating moisture emitted from the encapsulation organic layer EOL. The second encapsulation inorganic layer EIL2 may be single layered or multi-layered containing at least one inorganic material selected from an aluminum oxide, a titanium oxide, a tantalum oxide, a hafnium oxide, a zinc oxide, a silicon oxide, a silicon nitride, and a silicon oxynitride. The second encapsulation inorganic layer EIL2 may be formed through a deposition process.

Although not illustrated, a capping layer disposed between the second electrode E2 and the encapsulation layer ENC may be further included. The capping layer may include an organic material. The capping layer protects the second electrode E2 from the subsequent sputtering process and improves the light emission efficiency of the light emitting element. The capping layer may have a greater refractive index than that of the first encapsulation inorganic layer EIL1.

Referring to FIG. 3D, an additional planarization layer YPVX covering the encapsulation layer ENC may be disposed in the display area DA. The additional planarization layer YPVX may extend not only to the display area DA but also to the peripheral area surrounding an opening DTA. The peripheral area surrounding the display area DA and the opening DTA has an overall flat characteristic through the additional planarization layer YPVX disposed on the encapsulation layer ENC. In an embodiment, a touch electrode may be additionally formed between the encapsulation layer ENC and the additional planarization layer YPVX to sense a touch in the display area DA.

Figure 4A:
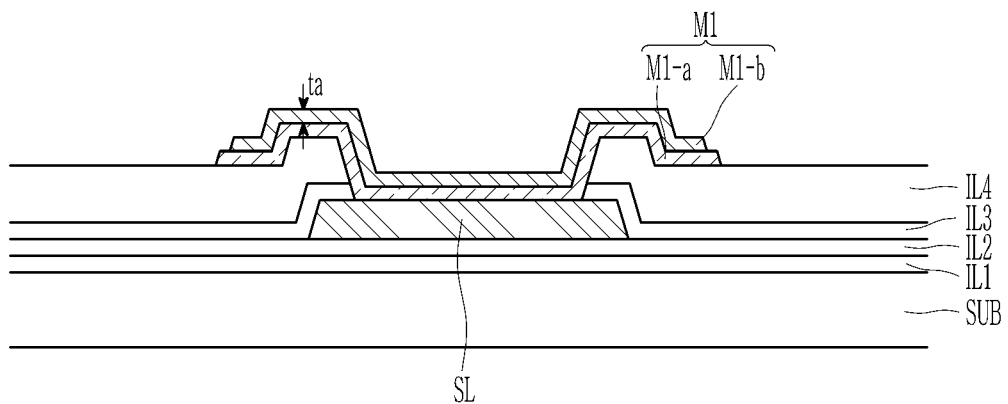
FIG. 4A is a cross-sectional view of a pad portion according to an embodiment.
Figure 4B:
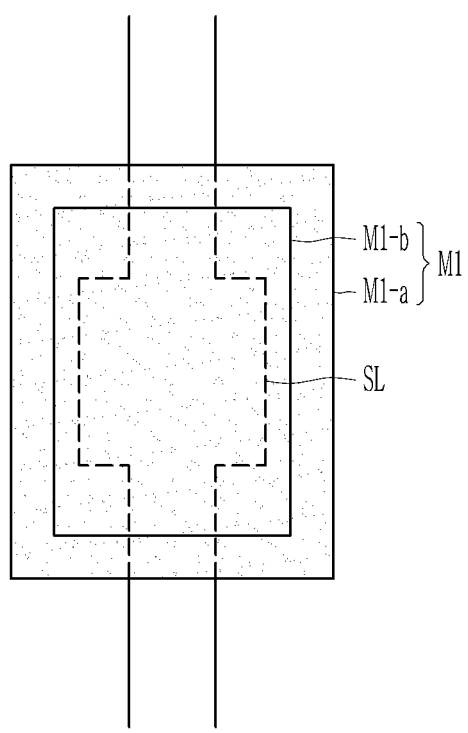
FIG. 4B is a top plan view of the pad portion according to an embodiment.
Figure 4C:
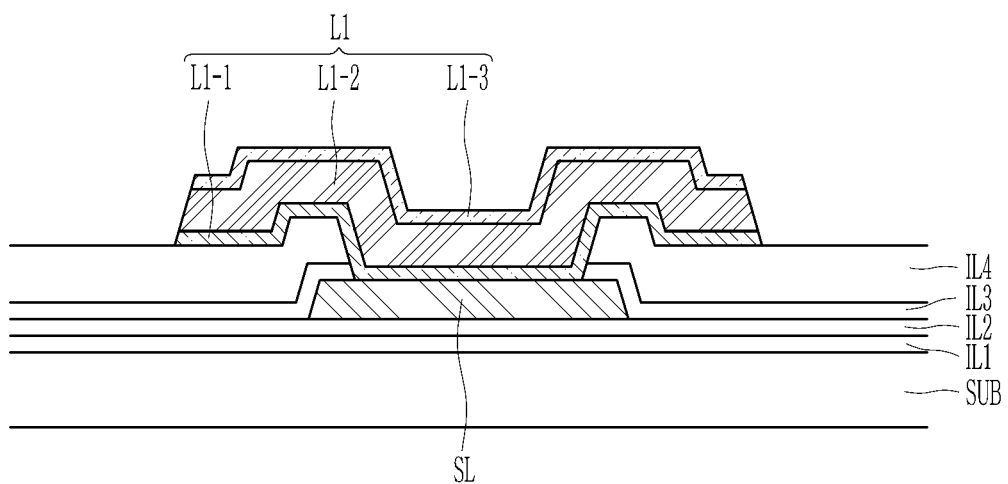
FIG. 4C, FIG. 4D, and FIG. 4E are cross-sectional views of the pad portion showing an embodiment of a manufacturing process.
Figure 4D:
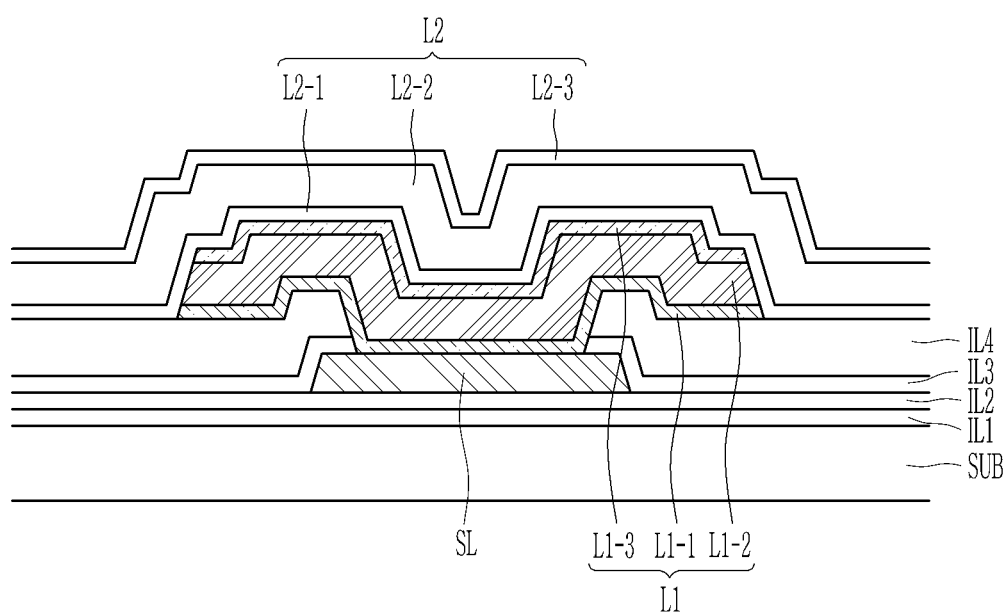
Figure 4E:
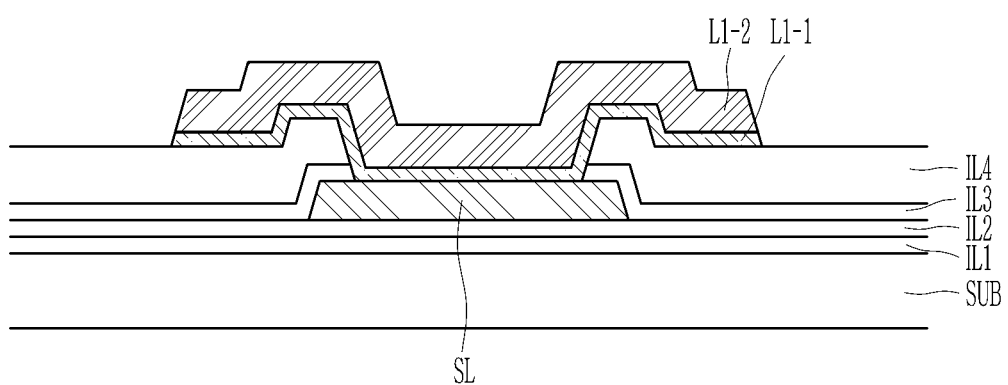

Hereinafter, the pad portion according to an embodiment will be described with reference to FIG. 4A to FIG. 4E. FIG. 4A is a cross-sectional view of a pad portion according to an embodiment, FIG. 4B is a top plan view of the pad portion according to an embodiment, and FIG. 4C, FIG. 4D, and FIG. 4E are cross-sectional views of the pad portion showing an embodiment of a manufacturing process. Specifically, FIG. 4A may correspond to a cross-sectional view taken along line A-A' of FIG. 2, and may be a cross-section of the pad portion PAD connected to the printed circuit board PCB. However, it is not restrictive, and may be a cross-section with respect to a lower area of the data driver 50 of FIG. 2. That is, it may be a cross-section of a pad portion that electrically connects the data driver 50 and the data line DL. A description of the same or like constituent elements as the constituent elements described above may be omitted, and previous drawings may be referred to.

First, referring to FIG. 4A and FIG. 4B, in an embodiment, an insulation layer disposed on the substrate SUB may be disposed on the pad portion. In FIG. 4A and FIG. 4B, a buffer layer IL1 and a first insulation layer IL2 disposed on a substrate SUB are illustrated, but is not limited thereto, and alternatively, at least one of the buffer layer IL1 and the first insulation layer IL2 may be omitted.

A signal wire SL is disposed on the first insulation layer IL2. In an embodiment, the signal wire SL may transmit a control signal, a driving voltage, or a common voltage to a data driver or a scan driver.

The signal wire SL may be formed in a same process as the process for forming the gate electrode GE described in FIG. 3B. The signal wire SL may include a same material as the gate electrode GE. The signal wire SL may be single layered or multi-layered in which a metal film including at least one selected from copper (Cu), a copper alloy, aluminum (Al), an aluminum alloy, molybdenum (Mo), a molybdenum alloy, titanium (Ti), and a titanium alloy is laminated.

A second insulation layer IL3 and a third insulation layer IL4 may be disposed on the signal wire SL. The second insulation layer IL3 and the third insulation layer IL4 may be single layered or multi-layered including at least one selected from inorganic insulators such as a silicon oxide, a silicon nitride, a silicon oxynitride, an aluminum oxide, a titanium oxide, a tantalum oxide, and a hafnium oxide.

A first metal pattern M1 may be disposed on the third insulation layer IL4. The first metal pattern M1 may be connected to the signal wire SL through an opening defined in the second insulation layer IL3 and the third insulation layer IL4. The first metal pattern M1 may connect the printed circuit board PCB and the signal wire SL described in FIG. 2. Alternatively, the first metal pattern M1 is disposed at a lower end of the data driver 50, and may connect the signal wire SL that transmits the data signal and the data driver 50.

In an embodiment, the first metal pattern M1 may be formed in a same process as the process for forming the source electrode SE and the drain electrode DE described in FIG. 3B. The first metal pattern M1 may include a first first sub-metal pattern M1-a and a second first sub-metal pattern M1-b. The second first sub-metal pattern M1-b may be connected to the printed circuit board. In an alternative embodiment, the second first sub-metal pattern M1-b may be connected to the data driver 50.

The first first sub-metal pattern M1-a may include a same material as the first layer DE-a disposed in the display area. The first first sub-metal pattern M1-a may include a first metal, for example, titanium. The first first sub-metal pattern M1-a may be formed in a same process as the process for forming the first layer DE-a disposed in the display area.

The second first sub-metal pattern M1-b may include a same material as the second layer DE-b disposed in the display area. The second first sub-metal pattern M1-b may include a second metal, for example, aluminum.

In an embodiment, as shown in FIG. 4B, a planar area of the first first sub-metal pattern M1-a may be greater than a planar area of the second first sub-metal pattern M1-b. In one embodiment, for example, an end of the first first sub-metal pattern M1-*a* may be protruded more outward than a corresponding end of the second first sub-metal pattern M1-*b*.

In an embodiment, a thickness $t_a$ of the second first sub-metal pattern M1-*b* may be smaller than a thickness $t_b$ of the second layer DE-b shown in FIG. 3C. The thickness $t_a$ of the second first sub-metal pattern M1-*b* may be about 1000 angstroms or less. The thickness $t_b$ of the second layer DE-b may be in a range from about 5000 angstroms to about 8000 angstroms as described above. The second first sub-metal pattern M1-*b* may be formed in a same process as the process for forming the second layer DE-b disposed in the display area. After forming a metal layer having the thickness of the second layer DE-b, the metal layer may be further etched to provide a thinner metal pattern such as the second first sub-metal pattern M1-*b*.

Hereinafter, an embodiment of a manufacturing method of the first metal pattern M1 will be described with reference to FIG. 4C to FIG. 4E.

Referring to FIG. 4C, the buffer layer IL1 and the first insulation layer IL2 are formed on the substrate SUB, and the signal wire SL is formed on the first insulation layer IL2. The signal wire SL may be formed in a same process as the process for forming the above-described gate electrode GE. The second insulation layer IL3 and the third insulation layer IL4 are formed on the signal wire SL.

The first metal layer L1 including a first first layer L1-1, a second first layer L1-2, and a third first layer L1-3 formed through a same process as the process for forming the source electrode SE and the drain electrode DE disposed in the display area DA is formed on the third insulation layer IL4. In one embodiment, for example, the first first layer L1-1, the second first layer L1-2, and the third first layer L1-3 may be formed through a dry etching process. The first first layer L1-1, the second first layer L1-2, and the third first layer L1-3 may be patterned to be in a shape of the first metal pattern M1.

The first first layer L1-1 is formed in a same process as the process for forming the first layer DE-a, and may include a same material as the first layer DE-a (e.g. titanium). The second first layer L1-2 is formed in a same process as the process for forming the second layer DE-b, and may include the same material as the second layer DE-b (e.g., aluminum). The third first layer L1-3 is formed in a same process as the process for forming the third layer DE-c and may include the same material as the third layer DE-c (e.g., titanium).

Next, as shown in FIG. 4D, a second metal layer L2 including a first second layer L2-1, a second second layer L2-2, and a third second layer L2-3 is formed on the substrate SUB. The first second layer L2-1, the second second layer L2-2, and the third second layer L2-3 form a connection electrode CE on a display area DA through an etching process, and may be completely removed in the pad portion as shown in FIG. 4D. The etching process may be a dry etching process.

In such an embodiment, as shown in FIG. 4E, the third first layer L1-3 may be simultaneously removed in the process of removing the first second layer L2-1, the second second layer L2-2, and the third second layer L2-3. The patterning process may be set to over-etch to form a certain pattern, and accordingly, while etching the first second layer L2-1 including the first metal, the third first layer L1-3 including a same first metal will also be etched.

Then, in the etching process of forming the first electrode E1 disposed on the display area DA, the second first layer L1-2 exposed to the outside may be partially etched. In one embodiment, for example, the process of forming the first electrode E1 may be a dry etching process.

Accordingly, as shown in FIG. 4A and FIG. 4B, a first metal pattern M1 including a first first sub-metal pattern M1-1 and a second first sub-metal pattern M1-2 may be formed. The second first sub-metal pattern M1-2 may be formed to have a thinner thickness than the second layer DE-b.

When the process of patterning the first second layer L2-1, the second second layer L2-2, and the third second layer L2-3 is performed, a tip may be formed in the first second layer L2 due to an etching solution used in the process for forming the first electrode. Such a tip becomes a conductive foreign material when being taken off by a cleaning process. If the conductive foreign material is disposed in the display area, it may cause pixel defects, and if disposed in the non-display area, short circuit defects may occur between signal wires. In an embodiment of the invention, since the first second layer L2-1 and the second second layer L2-2 are completely removed in the pad portion, the occurrence of defects due to such a tip may be effectively prevented.

In addition, the etching solution forming the first electrode may contain silver (Ag) ions as the etching process proceeds. The silver (Ag) ions may be reduced to the form of silver (Ag) particles by receiving electrons generated from the second first layer L1-2 containing aluminum. The silver (Ag) particles reduced in this way may move from the peripheral area PA to the display area DA by a physical or chemical cleaning process during processes from the process of removing the mask pattern to the deposition process of other constituent elements. Silver (Ag) particles moved to the display area DA may penetrate a light emitting diode or a thin film transistor such that dark areas may be generated in the display area DA by silver (Ag) particles.

In an embodiment of the invention, since the first metal pattern M1 includes the second first sub-metal pattern M1-2 with a fairly thin thickness, such that the generation of generated silver (Ag) particles may be significantly reduced.

In an embodiment, the thickness of the metal pattern disposed on the pad portion is formed to be quite thin, and thus bonding with the printed circuit board or data driver may be improved.

Figure 5A:
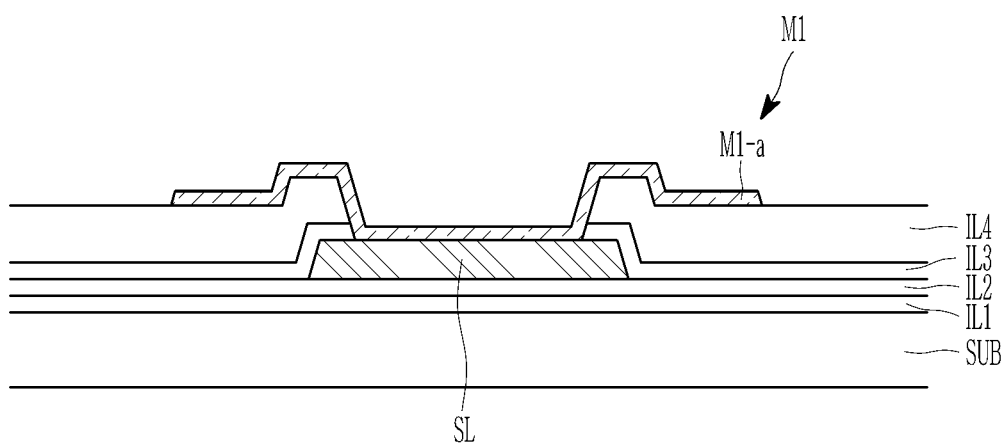
FIG. 5A is a cross-sectional view of a pad portion according to an embodiment.
Figure 5B:
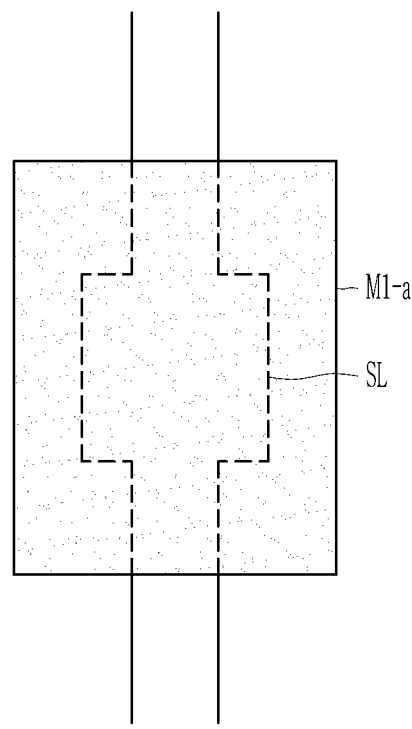
FIG. 5B is a top plan view of the pad portion according to an embodiment.
Figure 5C:
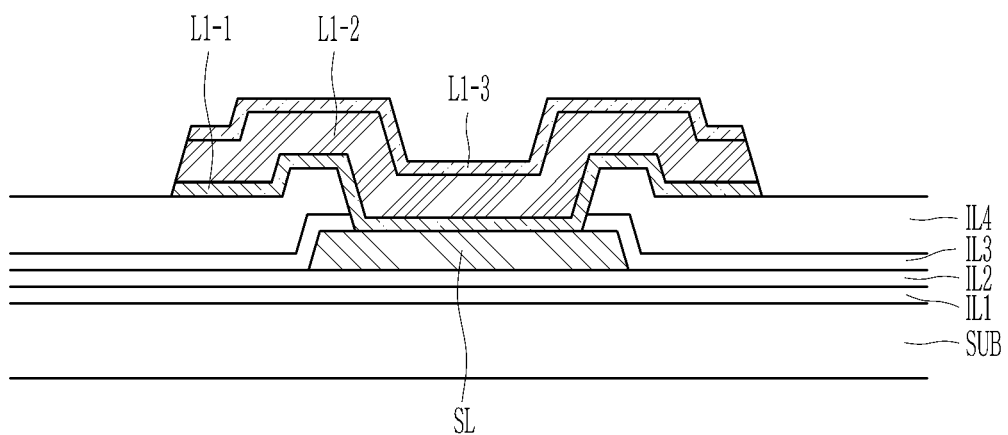
FIG. 5C, FIG. 5D, and FIG. 5E are cross-sectional views of the pad portion showing an embodiment of a manufacturing process.
Figure 5D:
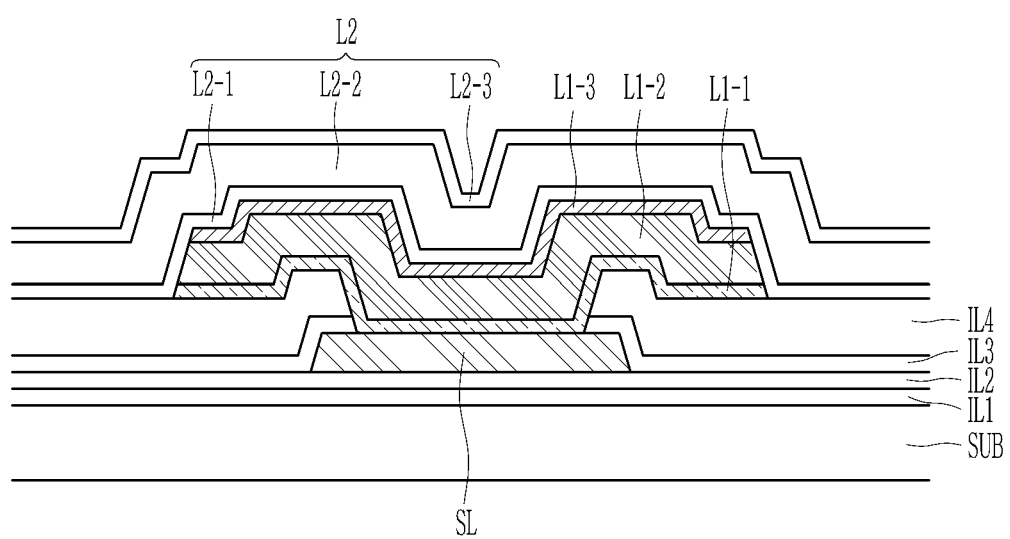
Figure 5E:
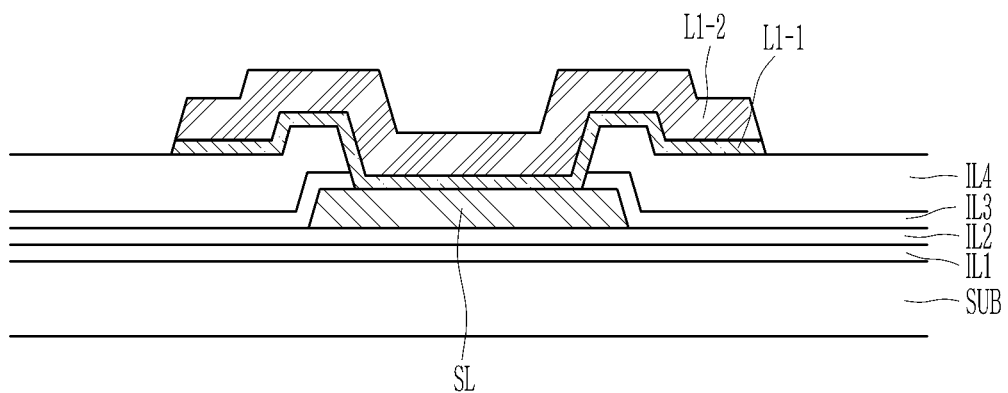

Hereinafter, a pad portion according to an embodiment will be described with reference to FIG. 5A to FIG. 5E. FIG. 5A is a cross-sectional view of a pad portion according to an embodiment, FIG. 5B is a top plan view of the pad portion according to an embodiment, and FIG. 5C, FIG. 5D, and FIG. 5E are cross-sectional views of the pad portion showing a manufacturing process. Specifically, FIG. 5A may correspond to a cross-sectional view taken along line A-A' of FIG. 2, and may be a cross-section of the pad portion PAD connected to the printed circuit board PCB. However, it is not restrictive, and may be a cross-section with respect to a lower area of the data driver 50 of FIG. 2. That is, the pad portion disposed at a lower end of a data driver 50 may electrically connect the data driver 50 and a data line DL. A description of the same or like constituent elements as the constituent elements described above may be omitted, and previous drawings may be referred to.

First, referring to FIG. 5A and FIG. 5B, a pad portion according to an embodiment may include an insulation layer disposed on a substrate SUB. In FIG. 5A, a buffer layer IL1 and a first insulation layer IL2 disposed on a substrate SUB are illustrated, but is not limited thereto, and alternatively, at least one of the buffer layer IL1 and the first insulation layer IL2 may be omitted.

A signal wire SL is disposed on the first insulation layer IL2. In an embodiment, the signal wire SL may transmit a control signal, a driving voltage, or a common voltage to a data driver or a scan driver.

The signal wire SL may be formed in a same process as a process for forming an electrode GE disposed in a display area. The signal wire SL may include a same material as the gate electrode GE. The signal wire SL may be a single layer or a multilayer in which a metal film including any one of copper (Cu), a copper alloy, aluminum (Al), an aluminum alloy, molybdenum (Mo), a molybdenum alloy, titanium (Ti), and a titanium alloy is laminated.

A second insulation layer IL3 and a third insulation layer IL4 may be disposed on the signal wire SL. The second insulation layer IL3 and the third insulation layer IL4 may be single layered or multi-layered including at least one of inorganic insulators such as a silicon oxide, a silicon nitride, a silicon oxynitride, an aluminum oxide, a titanium oxide, a tantalum oxide, and a hafnium oxide.

A first metal pattern M1 may be disposed on the third insulation layer IL4. The first metal pattern M1 may be connected to the signal wire SL through an opening of the second insulation layer IL3 and the third insulation layer IL4. The first metal pattern M1 may connect the printed circuit board PCB and the signal wire SL described in FIG. 2. Alternatively, the first metal pattern M1 is disposed at a lower end of the data driver 50, and may connect the signal wire SL that transmits the data signal and the data driver 50.

The first metal pattern M1 may be formed in the same process as the process for forming the source electrode SE and the drain electrode DE disposed in the display area.

The first metal pattern M1 may include a first first sub-metal pattern M1-*a*. The first first sub-metal pattern M1-*a* may be connected to a printed circuit board. Alternatively, the first first sub-metal pattern M1-*a* may be connected to the data driver 50.

The first first sub-metal pattern M1-*a* may include a same material as the first layer DE-a disposed in the display area. The first first sub-metal pattern M1-*a* may include a first metal, for example, titanium. The first first sub-metal pattern M1-*a* may be formed in a same process as the process for forming the first layer DE-a disposed in the display area. A thickness of the first first sub-metal pattern M1-*a* may be substantially to the same as a thickness of the first layer DE-a.

Hereinafter, an embodiment of a manufacturing method of the first metal pattern M1 will be described with reference to FIG. 5C to FIG. 5E.

Referring to FIG. 5C, the buffer layer IL1 and the first insulation layer IL2 are formed on the substrate SUB, and the signal wire SL is formed on the first insulation layer IL2. The second insulation layer IL3 and the third insulation layer IL4 are formed on the signal wire SL.

A first first layer L1-1, a second first layer L1-2, and a third first layer L1-3 formed through a same process as the process for forming the source electrode SE and drain electrode DE disposed in the display area DA are formed on the third insulation layer IL4. The first first layer L1-1, the second first layer L1-2, and the third first layer L1-3 may be patterned in the shape of the first metal pattern M1.

The first first layer L1-1 is formed in a same process as the process for forming the first layer DE-a, and may include a same material as the first layer DE-a. The second first layer L1-2 is formed in a same process as the process for forming the second layer DE-b, and may include a same material as the second layer DE-b. The third first layer L1-3 is formed in a same process as the process for forming the third layer DE-c, and may include a same material as the third layer DE-c.

Next, as shown in FIG. 5D, a second metal layer L2 including a first second layer L2-1, a second second layer L2-2, and a third second layer L2-3 is formed on the substrate SUB. The first second layer L2-1, the second second layer L2-2, and the third second layer L2-3 form a connection electrode CE on a display area DA through a patterning process, and may be completely removed in the pad portion as shown in FIG. 5E.

In such an embodiment, as shown in FIG. 5E, the third first layer L1-3 may be simultaneously removed in the process of removing the first second layer L2-1, the second second layer L2-2, and the third second layer L2-3. The patterning process may be set to over-etch to form a certain pattern, and accordingly, while etching the first second layer L2-1, the third first layer L1-3 will also be etched.

Then, the second first layer L1-2 shown in FIG. 5E is removed by additionally using a first etching solution such that the first metal pattern M1 shown in FIG. 5A and FIG. 5B may be formed.

A process of removing the second first layer L1-2 may be performed in a process prior to forming the first electrode E1. In an embodiment, a dedicated process for etching only the second first layers L1-2 may be added. In such an embodiment, Ag particles generated during the etching process of the first electrode E1 may be suppressed.

When the second first layer L1-2 is completely removed in the process of removing the second first layer L1-2, the generation of silver particles by a second etching solution used in the subsequent process of forming the first electrode E1 may be prevented.

Figure 6A:
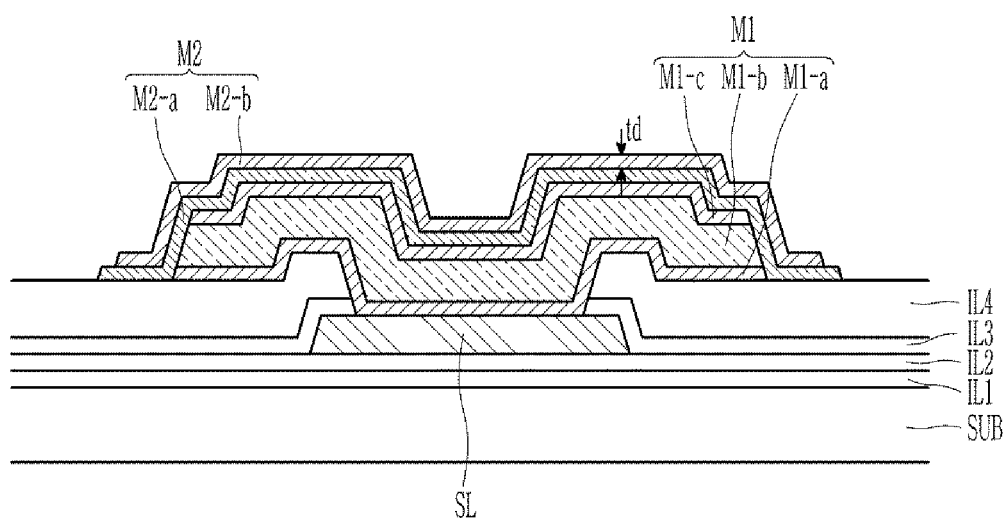
FIG. 6A is a cross-sectional view of a pad portion according to an embodiment.
Figure 6B:
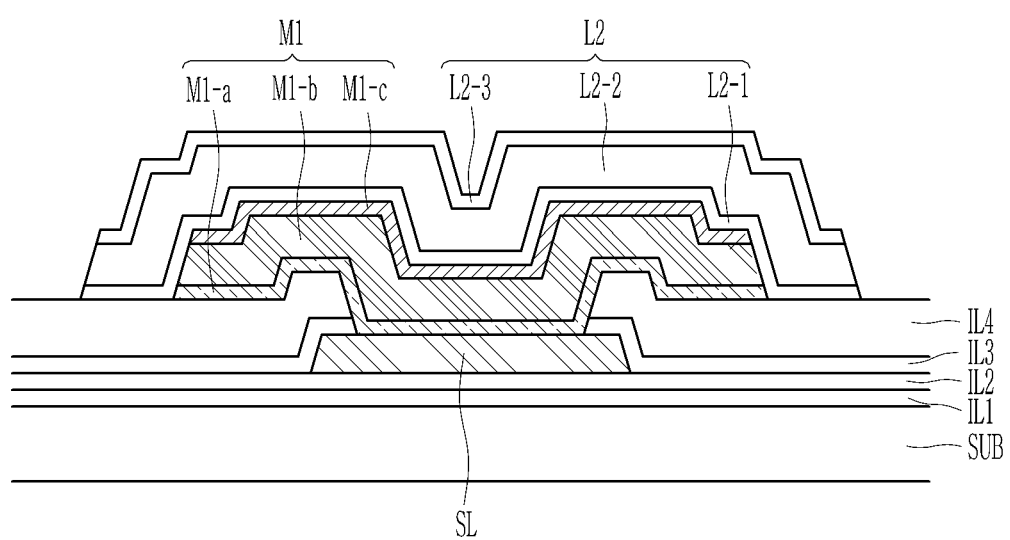
FIG. 6B, FIG. 6C, and FIG. 6D are cross-sectional views of the pad portion showing an embodiment of a manufacturing process.
Figure 6C:
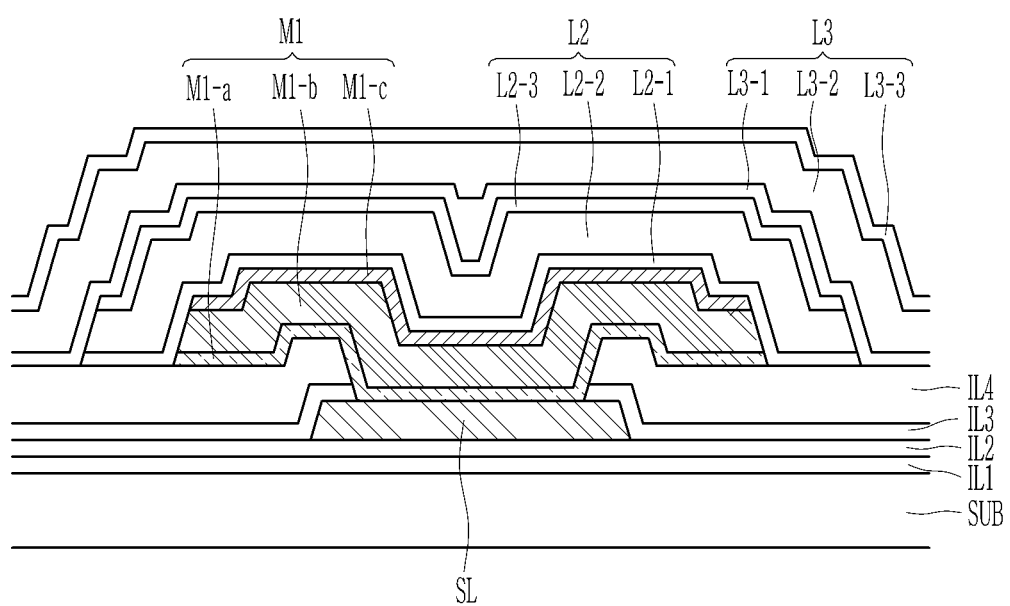
Figure 6D:
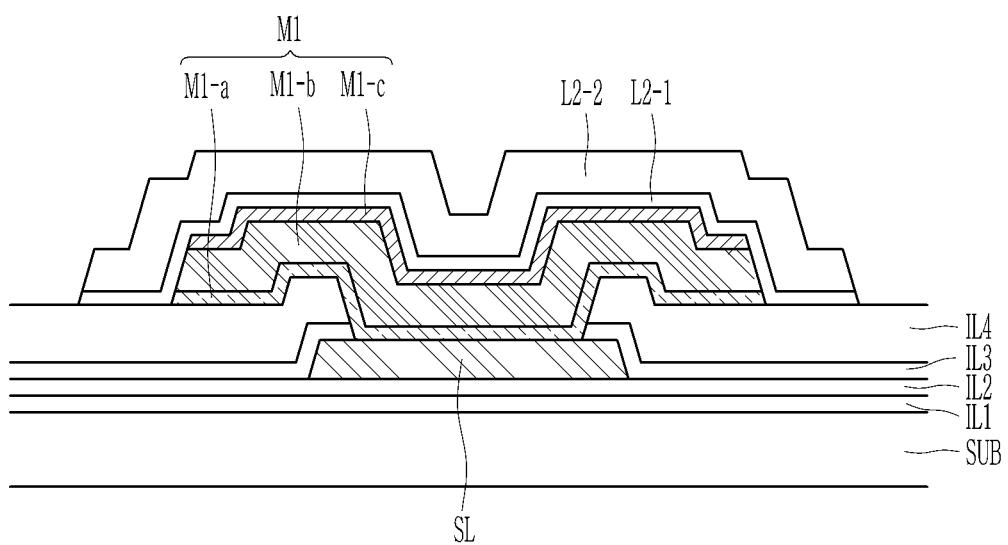

Hereinafter, a pad portion according to an embodiment will be described with reference to FIG. 6A to FIG. 6D. FIG. 6A is a cross-sectional view of a pad portion according to an embodiment, and FIG. 6B, FIG. 6C, and FIG. 6D are cross-sectional views of the pad portion showing an embodiment of a manufacturing process. Specifically, FIG. 6A may correspond to a cross-sectional view taken along line A-A' of FIG. 2, and may be a cross-section of the pad portion PAD connected to the printed circuit board PCB. However, it is not restrictive, and may be a cross-section with respect to a lower area of the data driver 50 of FIG. 2. That is, it may be a cross-section of a pad portion that electrically connects the data driver 50 and the data line DL. A description of the same or like constituent elements as the constituent elements may be omitted, and previous drawings may be referred to. In addition, an embodiment of FIG. 6A may be applied to a structure in which an additional conductive layer is located between the connection electrode CE and the first electrode E1 in the structure of the display area of FIG. 3B, and the additional conductive layer may have a same laminated structure as the connection electrode CE, the source electrode SE, and the drain electrode DE.

First, referring to FIG. 6A, a pad portion according to an embodiment may include an insulation layer disposed on a substrate SUB. In FIG. 6A, a buffer layer IL1 and a first insulation layer IL2 disposed on a substrate SUB are illustrated, but is not limited thereto, and alternatively, at least one of the buffer layer IL1 and the first insulation layer IL2 may be omitted.

A signal wire SL is disposed on the first insulation layer IL2. In an embodiment, the signal wire SL may transmit a control signal, a driving voltage, or a common voltage to a data driver or a scan driver.

The signal wire SL may be formed in a same process as a process for forming a gate electrode GE disposed in a display area. The signal wire SL may include a same material as the gate electrode GE.

A second insulation layer IL3 and a third insulation layer IL4 may be disposed on the signal wire SL. In an alternative embodiment, the third insulation layer IL4 may be omitted.

A first metal pattern M1 may be disposed on the third insulation layer IL4. The first metal pattern M1 may be connected to the signal wire SL through an opening defined in the second insulation layer IL3 and the third insulation layer IL4.

In an embodiment, the first metal pattern M1 may be formed in a same process as the process for forming the source electrode SE and the drain electrode DE disposed in the display area. The first metal pattern M1 may include a first first sub-metal pattern M1-a, a second first sub-metal pattern M1-b, and a third first sub-metal pattern M1-c. The first first sub-metal pattern M1-a may include a same material as the first layer DE-a disposed in the display area. The first first sub-metal pattern M1-a may include a first metal, for example, titanium. The first first sub-metal pattern M1-a may be formed in a same process as the process for forming the first layer DE-a disposed in the display area. The second first sub-metal pattern M1-b may include the same material as the second layer DE-b disposed in the display area. The second first sub-metal pattern M1-b may include a second metal, for example, aluminum. The second first sub-metal pattern M1-b may be formed through a same process as the process for forming the second layer DE-b disposed in the display area. The third first sub-metal pattern M1-c may include a first metal, for example, titanium. The third first sub-metal pattern M1-c may be formed in a same process as the process for forming the third layer DE-c disposed in the display area.

In an embodiment, the pad portion may further include a second metal pattern M2 disposed on the first metal pattern M1. The second metal pattern M2 may include a first second sub-metal pattern M2-a and a second second sub-metal pattern M2-b. The second second sub-metal pattern M2-b may be connected to the above-described printed circuit board. Alternatively, the second second sub-metal pattern M2-b may be connected to the above-described data driver 50.

The first second sub-metal pattern M2-a may be formed in a same process as a process for forming a fourth layer CE-a of the connection electrode CE disposed in the display area DA. The first second sub-metal pattern M2-a may include the same material as the fourth layer CE-a of the connection electrode CE disposed in the display area DA, and may include, for example, titanium.

The second second sub-metal pattern M2-b may be formed in the same process as a process for forming a fifth layer CE-b of the connection electrode CE disposed in the display area DA. The second second sub-metal pattern M2-b may include a same material as the fifth layer CE-b of the connection electrode CE disposed in the display area DA, for example, aluminum.

A thickness $t_d$ of the second second sub-metal pattern M2-b may be smaller than a thickness $t_c$ of the fifth layer CE-b. The thickness $t_d$ of the second second sub-metal pattern M2-b may be less than or equal to about 1000 angstroms. The thickness $t_c$ of the fifth layer CE-b may be in a range from about 5000 angstroms to about 8000 angstroms, as described above.

The manufacturing method of the second metal pattern M2 shown in FIG. 6A may adopt the manufacturing method of the first metal pattern M1 shown in FIG. 4A to FIG. 4D. Hereinafter, an embodiment of the manufacturing method will be described with reference to FIG. 6B to FIG. 6D.

As shown in FIG. 6B, the buffer layer IL1 and the first insulation layer IL2 are formed on the substrate SUB, and the signal wire SL is formed on the first insulation layer IL2. The signal wire SL may be formed in a same process as the process for forming the gate electrode GE. The second insulation layer IL3 and the third insulation layer IL4 are formed on the signal wire SL.

The first metal layer L1 formed through a same process as the process for forming the source electrode SE and drain electrode DE disposed in the display area DA is formed on the third insulation layer IL4.

Next, a second metal layer L2 including a first second layer L2-1, a second second layer L2-2, and a third second layer L2-3 is formed on the first metal pattern M1. In one embodiment, for example, the first second layer L2-1, the second second layer L2-2, and the third second layer L2-3 may be formed through a dry etching process. The first second layer L2-1, the second second layer L1-2, and the third second layer L2-3 may be patterned in the shape of the above-described second metal pattern M2. The first second layer L2-1 may include titanium, the second second layer L2-2 may include aluminum, and the third second layer L2-3 may include titanium.

Next, as shown in FIG. 6C, a third metal layer L3 including a first third layer L3-1, a second third layer L3-2, and a third third layer L3-3 is formed on the substrate SUB.

Then, as shown in FIG. 6D, the first third layer L3-1, the second third layer L3-2, and the third third layer L3-3 are completely removed in a pad portion that corresponds to a non-display area through an etching process. The etching process may be a dry etching process. In this case, the third second layer L2-3 may be simultaneously removed in the process for removing the first third layer L3-1, the second third layer L3-2, and the third third layer L3-3. The patterning process may be set to over-etch to form a certain pattern, and accordingly, while etching the first third layer L3-1, the third second layer L2-3 including the same first metal will also be etched.

Then, the second second layer L2-2 exposed to the outside may be partially etched during an etching process for forming a first electrode E1 disposed on the display area DA. In one embodiment, for example, the process of forming the first electrode E1 may be a dry etching process.

Accordingly, as shown in FIG. 6A, a second metal pattern M2 including a first second sub-metal pattern M2-a and a second second sub-metal pattern M1-b can be formed. The second second sub-metal pattern M2-2 may be formed to have a thinner thickness than a second layer of a connection electrode in the display area, formed through a same process.

When a process for patterning the first third layer L3-1, the second third layer L3-2, and the third third layer L3-3 in the non-display area is performed, a tip may be formed in the first third layer L3-1 due to an etching solution used in the process for forming the first electrode. Such a tip becomes a conductive foreign material when being taken off by a cleaning process. If the conductive foreign material is disposed in the display area, it may cause pixel defects, and if disposed in the non-display area, short circuit defects may occur between signal wires. In an embodiment of the invention, since the first third layer L3-1 and the second third layer L3-2 are completely removed in the pad portion the occurrence of defects due to the tip may be effectively prevented.

Figure 7:
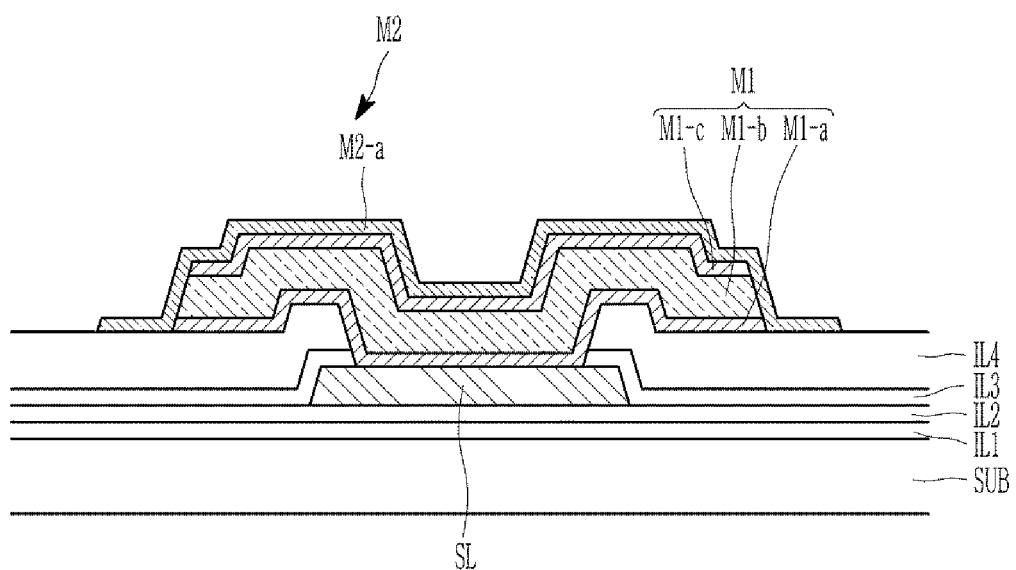
FIG. 7 is a cross-sectional view of a pad portion according to an embodiment.

Hereinafter, a pad portion according to an embodiment will be described with reference to FIG. 7. FIG. 7 is a cross-sectional view of a pad portion according to an embodiment.

Referring to FIG. 7, a pad portion according to an embodiment may include an insulation layer disposed on a substrate SUB. In FIG. 7, a buffer layer IL1 and a first insulation layer IL2 disposed on a substrate SUB are illustrated, but is not limited thereto, and alternatively, at least one of the buffer layer IL1 and the first insulation layer IL2 may be omitted.

A signal wire SL is disposed on the first insulation layer IL2. In an embodiment, the signal wire SL may transmit a control signal, a driving voltage, or a common voltage to a data driver or a scan driver.

The signal wire SL may be formed in a same process as a process for forming an electrode GE disposed in a display area. The signal wire SL may include a same material as the gate electrode GE.

A second insulation layer IL3 and a third insulation layer IL4 may be disposed on the signal wire SL.

A first metal pattern M1 may be disposed on the third insulation layer IL4. The first metal pattern M1 may be connected with the signal wire SL through an opening defined in the second insulation layer IL3 and the third insulation layer IL4.

The first metal pattern M1 may be formed in a same process for forming a source electrode SE and a drain electrode DE disposed in the display area. The first metal pattern M1 may include a first first sub-metal pattern M1-*a*, a second first sub-metal pattern M1-*b*, and a third first sub-metal pattern M1-*c*. The first first sub-metal pattern M1-*a* may include a same material as a first layer DE-a disposed in the display area. The first first sub-metal pattern M1-*a* may include a first metal, for example, titanium. The first first sub-metal pattern M1-*a* may be formed in a same process as the process for forming the first layer DE-a disposed in the display area. The second first sub-metal pattern M1-*b* may include a same material as the second layer DE-b disposed in the display area. The second first sub-metal pattern M1-*b* may include a second metal, for example, aluminum. The second first sub-metal pattern M1-*b* may be formed in the same process as the process for forming the second layer DE-b disposed in the display area. The third first sub-metal pattern M1-*c* may include a first metal, for example titanium. The third first sub-metal pattern M1-*c* may be formed in a same process as the process for forming the third layer DE-c disposed in the display area.

In an embodiment, the pad portion may further include a second metal pattern M2 disposed on the first metal pattern M1. The second metal pattern M2 may include a first second sub-metal pattern M2-*a*. The first second sub-metal pattern M2-*a* may be connected with the above-described printed circuit board. Alternatively, the first second sub-metal pattern M2-*a* is disposed at a lower end portion of a data driver 50, and may connect a signal line SL for transmitting a data signal from the data driver 50.

The first second sub-metal pattern M2-*a* may be formed in a same process as a process for forming a fourth layer CE-a of the connection electrode CE disposed in the display area DA. The first second sub-metal pattern M2-*a* may include a same material as the fourth layer CE-a of the connection electrode CE disposed in the display area DA, and may include, for example, titanium. A thickness of the first sub-metal pattern M2-*a* and a thickness of the fourth layer CE-a may be substantially the same as each other.

A manufacturing method of a second metal pattern M2 shown in FIG. 7 may adopt the manufacturing method of the first metal pattern M1 of FIG. 5A to FIG. 5D. Hereinafter, an embodiment of a manufacturing method of a second metal pattern M2 will be described with reference to above-described FIG. 6B to FIG. 6D.

As shown in FIG. 6B, the buffer layer IL1 and the first insulation layer IL2 are formed on the substrate SUB, and the signal wire SL is formed on the first insulation layer IL2. The signal wire SL may be formed in a same process as the process for forming the gate electrode GE. The second insulation layer IL3 and the third insulation layer IL4 are formed on the signal wire SL.

The first metal pattern M1 is formed on the third insulation layer IL4 in a same process as the process for forming the source electrode SE and the drain electrode DE disposed in the display area DA.

Next, a second metal layer L2 including a first first layer L2-1, a second second layer L2-2, and a third second layer L2-3 is formed on the first metal pattern M1. In one embodiment, for example, the first second layer L2-1, the second second layer L2-2, and the third second layer L2-3 may be formed through a dry etching process. The first second layer L2-1, the second second layer L1-2, and the third second layer L2-3 may be patterned in the shape of the above-described second metal pattern M2. The first second layer L2-1 may include titanium, the second second layer L2-2 may include aluminum, and the third second layer L2-3 may include titanium.

Next, as shown in FIG. 6C, a third metal layer L3 including the first third layer L3-1, the second third layer L3-2, and the third third layer L3-3 is formed on the substrate SUB. The first third layer L3-1, the second third layer L3-2, and the third third layer L3-3 may be completely removed in the pad portion as shown in FIG. 6D. The etching process may be a dry etching process. In this case, the third second layer L2-3 may be simultaneously removed in the process for removing the first third layer L3-1, the second third layer L3-2, and the third third layer L3-3. The patterning process may be set to over-etch to form a certain pattern, and accordingly, while etching the first third layer L3-1, the third second layer L2-3 including the same first metal will also be etched.

Then, the second metal pattern M2 shown in FIG. 7 may be formed by removing the second layer L2-2 shown in FIG. 6D by additionally using a first etching solution.

A process of removing the second second layer L2-2 may be performed in a process prior to forming the first electrode E1. In such an embodiment, a dedicated process for etching only the second second layers L2-2 may be added. Through this, Ag particles generated during the etching process of the first electrode E1 may be suppressed.

When the second second layer L2-2 is completely removed in the process of removing the second second layer L2-2, the generation of silver particles by a second etching solution used in the subsequent process of forming the first electrode E1 may be prevented.

Figure 8A:
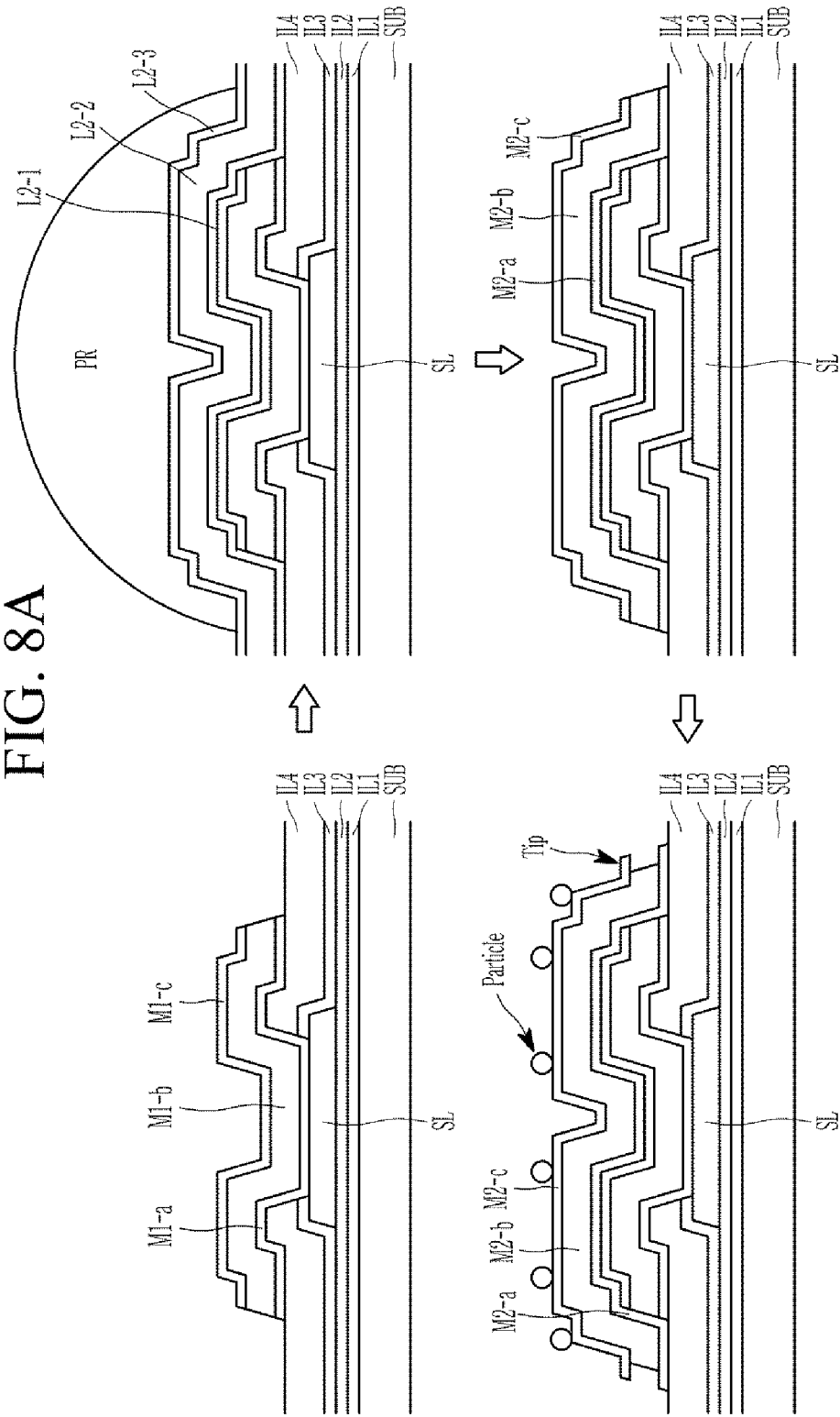
FIG. 8A is a cross-sectional view of a pad portion according to a comparative example.
Figure 8B:
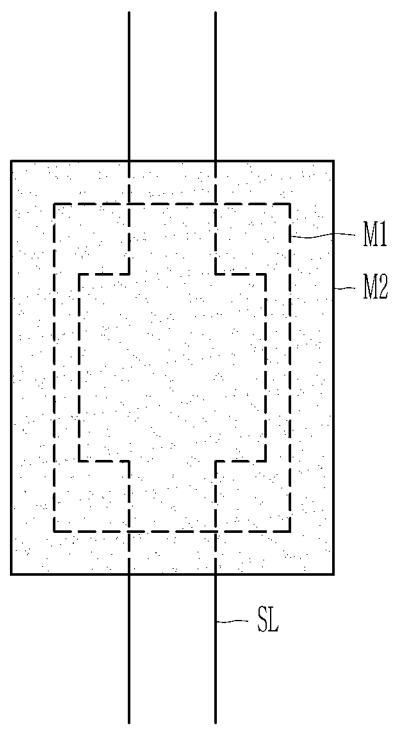
FIG. 8B is a top plan view of the pad portion according to the comparative example.

Hereinafter, a pad portion according to a comparative example will be described with reference to FIG. 8A and FIG. 8B. FIG. 8A is a cross-sectional view of a pad portion according to a comparative example, and FIG. 8B is a top plan view of the pad portion according to the comparative example. A description of the same or like constituent elements as the constituent elements described above may be omitted.

Referring to FIG. 8A and FIG. 8B, a pad portion according to a comparative example may include a first metal pattern M1 disposed on a third insulation layer IL4. The first metal pattern M1 may be formed in a same process as the process for forming a source electrode SE and a drain electrode DE disposed in a display area. The first metal pattern M1 may include a first first sub-metal pattern M1-*a*, a second first sub-metal pattern M1-*b*, and a third first sub-metal pattern M1-*c*. The first first sub-metal pattern M1-*a* may include a same material as a first layer DE-a disposed in the display area. The first first sub-metal pattern M1-*a* may include a first metal, for example, titanium. The first first sub-metal pattern M1-*a* may be formed in the same process as the process for forming the first layer DE-a disposed in the display area. The second first sub-metal pattern M1-*b* may include the same layer as a second layer DE-b disposed in the display area. The second first sub-metal pattern M1-*b* may include a second metal, for example, aluminum. The second first sub-metal pattern M1-*b* may be formed in a same process as the process for forming the second layer DE-b disposed in the display area. The third first sub-metal pattern M1-*c* may include the first metal, for example, titanium. The third first sub-metal pattern M1-*c* may be formed in a same process as a process for forming a third layer DE-c disposed in the display area.

In such a comparative example, a first second layer L2-1, a second second layer L2-2, and a third second layer L2-3 formed on the first metal pattern M1 are formed. The first second layer L2-1, the second second layer L2-2, and the third second layer L2-3 may be patterned to a second metal pattern M2 by using a photosensitive pattern ("PR"). The second metal pattern M2 may include a first second sub-metal pattern M2-*a*, a second second sub-metal pattern M2-*b*, and a third second sub-metal pattern M2-*c*. The third second sub-metal pattern M2-*c* may be connected with the above-described printed circuit board. Alternatively, the third second sub-metal pattern M2-*c* may be connected with the above-described data driver 50.

The first second sub-metal pattern M2-*a* may be formed in a same process as a process for forming a fourth layer CE-a of a connection electrode CE disposed in the display area DA. The first second sub-metal pattern M2-*a* may include the same material as the fourth layer CE-a of the connection electrode CE disposed in the display area DA, and may include, for example, titanium.

The second second sub-metal pattern M2-*b* may be formed in the same process as a process for forming a fifth layer CE-b of the connection electrode CE disposed in the display area DA. The second second sub-metal pattern M2-*b* may include the same material as the fifth layer CE-b of the connection electrode CE positioned in the display area DA, and may include, for example, aluminum.

The third second sub-metal pattern M2-*c* may be formed in the same process as a process for forming a sixth layer CE-c of the connection electrode CE disposed in the display area DA. The third second sub-metal pattern M2-*c* may include the same material as the sixth layer CE-c of the connection electrode CE positioned in the display area DA, and may include, for example, titanium.

In such a comparative example, when a process for patterning the first second layer L2-1, the second second layer L2-2, and the third second layer L2-3, a tip may be formed in the first second sub-metal pattern M2-*a* due to an etching solution used in the process for forming the first electrode. Such a tip becomes a conductive foreign material when being taken off by a cleaning process. When the conductive foreign material is disposed in the display area, it may cause pixel defects, and when disposed in the non-display area, short circuit defects may occur between signal wires.

In such a comparative example, the etching solution forming the first electrode contains Ag ions as the etching process proceeds. The silver (Ag) ions can be reduced to the form of silver (Ag) particles by receiving electrons generated from the second second sub-metal pattern M2-*b* containing aluminum. The silver (Ag) particles reduced in this way may move from the peripheral area PA to the display area DA by a physical or chemical cleaning process ranging from the process of removing the mask pattern to the deposition process of other constituent elements. Silver (Ag) particles that have moved to the display area DA may penetrate a light emitting diode or a thin film transistor. There may be a problem in that dark areas are generated in the display area DA by silver (Ag) particles.

Figure 9:
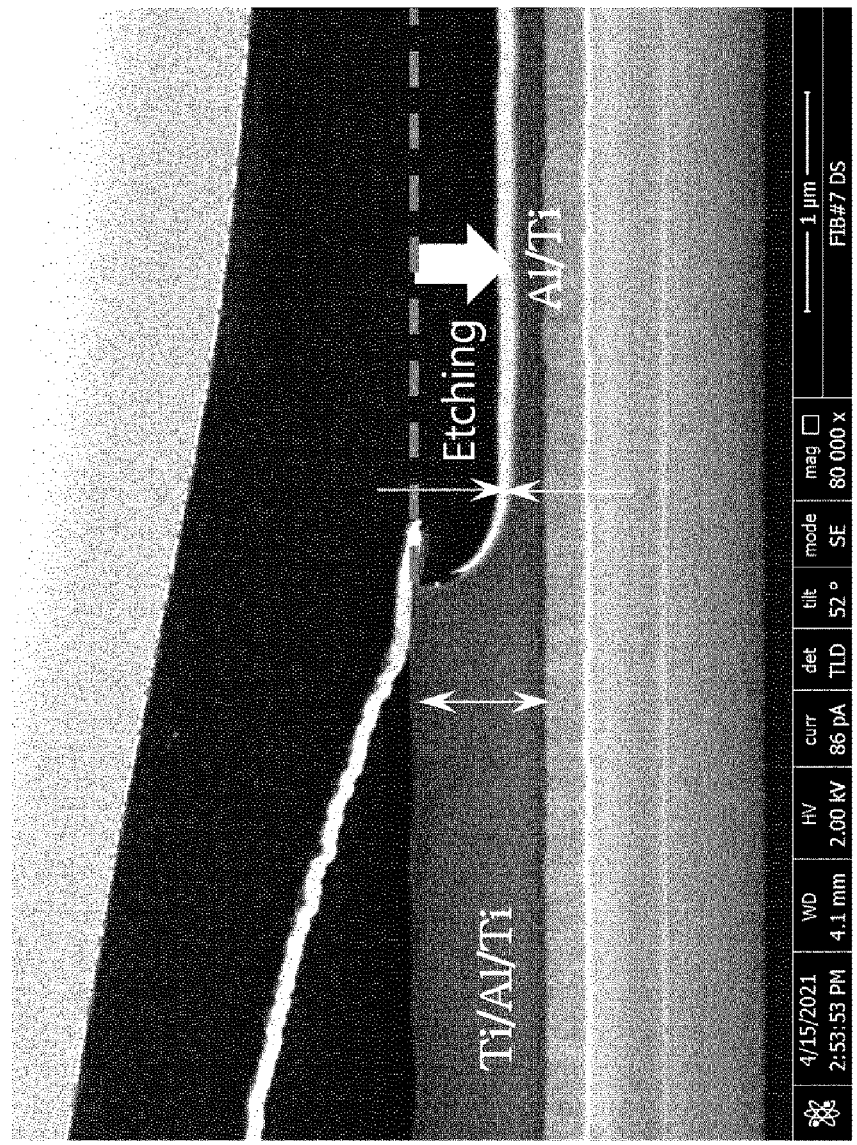
FIG. 9 is a cross-section image of etched aluminum and titanium wire according to an embodiment.

Hereinafter, a cross-section according to an embodiment will be described with reference to FIG. 9. FIG. 9 is a cross-section image of etched aluminum and titanium wire according to an embodiment.

As shown in FIG. 9, the first metal layer formed in a same process as the process for forming the source electrode and the drain electrode, and the second metal layer formed in a same process as the process for forming the connecting electrode are etched, and as shown in FIG. 4A, it was determined that the first first sub-metal pattern (including Ti) and the second first sub-metal pattern (Al) of a thin thickness may be formed.

Specifically, in an embodiment in which a lower titanium wire with a thickness of about 500 angstroms is formed, an aluminum wire with a thickness of about 6000 angstroms (red arrow on the left) is formed on the lower titanium wire, and an upper titanium wire with a thickness of about 300 angstroms is formed on the aluminum wire, it is shown that a thin aluminum wire with a thickness of about 1000 angstroms (red arrow on the right) may be formed through partial etching.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:
1. A display device comprising:
   a substrate including a display area and a non-display area;
   a transistor and a light emitting element which are disposed on the display area;
   a pad portion disposed in the non-display area, wherein the pad portion includes a metal pattern; and
   a printed circuit board or a data driver, which is connected with the pad portion,
   wherein the transistor comprises:
   a semiconductor layer disposed on the substrate; and
   a source electrode or a drain electrode which is electrically connected with the semiconductor layer,
   wherein the source electrode or the drain electrode comprises:
   a first layer including a first metal;
   a second layer including a second metal; and a third layer including the first metal, wherein the metal pattern includes the first metal, and is connected with the printed circuit board or the data driver, and wherein the metal pattern consists of:
- a first sub-metal pattern including the first metal; and
- a second sub-metal pattern including the second metal, wherein a thickness of the second sub-metal pattern is thinner than a thickness of the second layer.

2. The display device of claim 1, wherein
the first metal includes titanium, and
the second metal includes aluminum.

3. The display device of claim 1, wherein
the second sub-metal pattern is connected with the printed circuit board or the data driver.

4. The display device of claim 3, wherein
a thickness of the second layer is in a range from about 5000 angstroms to about 8000 angstroms, and
a thickness of the second sub-metal pattern is about 1000 angstroms or less.

5. The display device of claim 1, further comprising:
a connection electrode which electrically connects the drain electrode and the light emitting element to each other.

6. The display device of claim 5, wherein the connection electrode comprises:
a fourth layer including the first metal;
a fifth layer including the second metal; and
a sixth layer including the first metal.

* * * * *